United States Patent
Tsukao et al.

(10) Patent No.: US 11,195,813 B2
(45) Date of Patent: Dec. 7, 2021

(54) ANISOTROPIC CONDUCTIVE FILM AND PRODUCTION METHOD OF THE SAME

(71) Applicant: DEXERIALS CORPORATION, Tokyo (JP)

(72) Inventors: Reiji Tsukao, Utsunomiya (JP); Yasushi Akutsu, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 481 days.

(21) Appl. No.: 15/115,813

(22) PCT Filed: Feb. 4, 2015

(86) PCT No.: PCT/JP2015/053040
§ 371 (c)(1),
(2) Date: Aug. 1, 2016

(87) PCT Pub. No.: WO2015/119131
PCT Pub. Date: Aug. 13, 2015

(65) Prior Publication Data
US 2017/0012015 A1 Jan. 12, 2017

(30) Foreign Application Priority Data

Feb. 4, 2014 (JP) .............................. JP2014-019860
Feb. 4, 2014 (JP) .............................. JP2014-019862

(51) Int. Cl.
*H01L 23/00* (2006.01)
*B32B 27/08* (2006.01)
(Continued)

(52) U.S. Cl.
CPC .............. *H01L 24/29* (2013.01); *B32B 27/08* (2013.01); *B32B 27/20* (2013.01); *B32B 27/308* (2013.01);
(Continued)

(58) Field of Classification Search
CPC . H01L 24/29; H01L 2224/2919; B32B 27/40; B32B 27/32; B32B 27/20;
(Continued)

(56) References Cited

U.S. PATENT DOCUMENTS 6,020,059 A * 2/2000 Yamada ..................... C09J 9/02
428/328
6,214,446 B1 * 4/2001 Funada ................... B32B 27/20
428/212

(Continued)

FOREIGN PATENT DOCUMENTS

CN 101432931 B 4/2013
JP H06-283225 A 10/1994
(Continued)

OTHER PUBLICATIONS

May 12, 2015 International Search Report issued in Patent Application No. PCT/JP2015/053040.
(Continued)

*Primary Examiner* — Moazzam Hossain
*Assistant Examiner* — Stanetta D Isaac
(74) *Attorney, Agent, or Firm* — Oliff PLC

(57) ABSTRACT

A first anisotropic conductive film 1A or a second anisotropic conductive film 1B has a first insulating resin layer 2 and a second insulating resin layer 3. The first insulating resin layer 2 is formed of a photopolymerized resin, and the second insulating resin layer 3 is formed of a polymerizable resin. Conductive particles 10 are disposed in a single layer on a surface of the first insulating resin layer 2 on a side of the second insulating resin layer 3. The first anisotropic conductive film further has a third insulating resin layer 4 formed of a polymerizable resin, and the second anisotropic conductive film 1B has an intermediate insulating resin layer 6. The intermediate insulating resin layer 6 is formed of a (Continued)

resin containing no polymerization initiator, and is in contact with the conductive particles 10. These anisotropic conductive films have favorable connection reliability.

40 Claims, 11 Drawing Sheets

(51) Int. Cl.
| | | |
|---|---|---|
| *B32B 27/20* | (2006.01) | |
| *B32B 27/30* | (2006.01) | |
| *B32B 27/32* | (2006.01) | |
| *B32B 27/38* | (2006.01) | |
| *B32B 27/40* | (2006.01) | |
| *H01R 11/01* | (2006.01) | |
| *C09J 163/00* | (2006.01) | |
| *C09J 4/00* | (2006.01) | |
| *C09J 201/00* | (2006.01) | |

(52) U.S. Cl.
CPC .............. *B32B 27/32* (2013.01); *B32B 27/38* (2013.01); *B32B 27/40* (2013.01); *C09J 4/00* (2013.01); *C09J 163/00* (2013.01); *C09J 201/00* (2013.01); *H01L 24/00* (2013.01); *H01L 24/27* (2013.01); *H01R 11/01* (2013.01); *B32B 2307/202* (2013.01); *B32B 2307/206* (2013.01); *B32B 2307/706* (2013.01); *H01L 2224/27003* (2013.01); *H01L 2224/27334* (2013.01); *H01L 2224/2919* (2013.01); *H01L 2224/29083* (2013.01); *H01L 2224/29499* (2013.01); *H01L 2224/32227* (2013.01)

(58) Field of Classification Search
CPC ....... B32B 27/08; B32B 27/38; B32B 27/308; B32B 2307/706; B32B 2307/206; C09J 201/00; C09J 4/00; C09J 163/00; H01R 11/01
See application file for complete search history.

(56) References Cited

U.S. PATENT DOCUMENTS

| | | | | |
|---|---|---|---|---|
| 2005/0277231 | A1* | 12/2005 | Hembree | H01L 27/1462 438/127 |
| 2007/0040153 | A1* | 2/2007 | Jung | C08K 3/08 252/500 |
| 2009/0090545 | A1* | 4/2009 | Usui | H01L 24/27 174/260 |
| 2009/0239082 | A1* | 9/2009 | Fujita | H05K 3/323 428/413 |
| 2012/0029110 | A1* | 2/2012 | Washiya | G11B 5/855 522/182 |
| 2013/0213691 | A1* | 8/2013 | Park | H01B 3/082 174/126.4 |
| 2014/0355226 | A1* | 12/2014 | Kim | H05K 3/323 361/749 |
| 2015/0208511 | A1* | 7/2015 | Ishimatsu | B32B 3/30 361/749 |
| 2015/0214176 | A1* | 7/2015 | Shinohara | C08G 59/68 361/767 |
| 2015/0243626 | A1* | 8/2015 | Sato | B32B 7/12 428/166 |
| 2015/0271918 | A1* | 9/2015 | Akutsu | H01L 24/29 361/760 |
| 2015/0319867 | A1* | 11/2015 | Sato | H05K 3/323 361/760 |
| 2016/0049297 | A1* | 2/2016 | Tanikawa | H01L 24/27 438/118 |
| 2016/0215183 | A1* | 7/2016 | Tanaka | C09J 7/35 |

FOREIGN PATENT DOCUMENTS

| | | |
|---|---|---|
| JP | H08-148211 A | 6/1996 |
| JP | 2001-052778 A | 2/2001 |
| JP | 2008034232 A | 2/2008 |
| JP | 2010-033793 A | 2/2010 |
| JP | 2010-199087 A | 9/2010 |
| JP | 2010-257991 A | 11/2010 |
| JP | 4789738 B2 | 10/2011 |
| JP | 2012-169263 A | 9/2012 |
| JP | 2012-172128 A | 9/2012 |
| JP | 2013-058412 A | 3/2013 |
| JP | 2013-105636 A | 5/2013 |
| JP | 2013-149466 A | 8/2013 |
| TW | I274780 B | 3/2007 |
| TW | I377240 B | 11/2012 |
| TW | 201322276 A | 6/2013 |
| WO | 2013/073563 A1 | 5/2013 |

OTHER PUBLICATIONS

Mar. 12, 2018 Office Action issued in Chinese Patent Application No. 201580007324.0.
Dec. 4, 2018 Office Action issued in Chinese Patent Application No. 201580007324.0.
May 28, 2019 Office Action issued in Taiwanese Patent Application No. 104103837.
May 4, 2020 Office Action issued in Taiwanese Patent Application No. 104103837.
Jan. 7, 2019 Office Action issued in Taiwanese Patent Application No. 104103837.
Apr. 24, 2019 Office Action issued in Chinese Patent Application No. 2015/80007324.0.
Aug. 24, 2021 Office Action issued in Korean Patent Application No. 10-2016-7021102.

* cited by examiner

ANISOTROPIC CONDUCTIVE FILM AND PRODUCTION METHOD OF THE SAME

TECHNICAL FIELD

The present invention relates to an anisotropic conductive film and a production method of the same.

BACKGROUND ART

An anisotropic conductive film has been widely used in mounting of electronic components such as an IC chip. In recent years, an anisotropic conductive film having conductive particles for anisotropic conductive connection arranged in a single layer and an insulating resin layer of a two-layer structure has been proposed (Patent Literature 1), in order to improve the connection reliability and the insulating properties, increase the conductive particle capture ratio, and decrease the production cost from the viewpoints of application to high-density mounting.

This anisotropic conductive film is produced by densely disposing conductive particles in a single layer on an adhesive layer, biaxially stretching the adhesive layer to form a sheet in which the conductive particles are arranged, transferring the conductive particles on the sheet onto an insulating resin layer containing a thermosetting resin and a latent curing agent, and laminating another insulating resin layer containing a thermosetting resin and no latent curing agent on the transferred conductive particles (Patent Literature 1).

CITATION LIST

Patent Literature

Patent Literature 1: Japanese Patent No. 4789738

SUMMARY OF INVENTION

Technical Problem

However, the insulating resin layer containing no latent curing agent is used for the anisotropic conductive film in Patent Literature 1. Therefore, a comparatively large resin flow tends to occur in the insulating resin layer containing no latent curing agent by heating during anisotropic conductive connection. Along the resin flow, the conductive particles also tend to flow. While the conductive particles are arranged in a single layer at uniform intervals by biaxial stretching, there are problems such as a decrease in conductive particle capture ratio and occurrence of short circuit.

An object of the present invention is to solve the problems in the conventional techniques, and to achieve favorable conductive particle capture ratio, favorable connection reliability, and a decrease in occurrence of short circuit in an anisotropic conductive film having a multilayer structure having conductive particles arranged in a single layer.

Solution to Problem

The present inventor has found that an anisotropic conductive film obtained by disposing conductive particles in a single layer on a surface of a photopolymerizable resin layer, irradiating the photopolymerizable resin layer with ultraviolet light to fix the conductive particles in a photopolymerized resin, and layering two thermo- or photo-polymerizable resin layers on the fixed conductive particles or an anisotropic conductive film in which an intermediate insulating resin layer is provided around the fixed conductive particles as a relaxation layer against a stress applied to the conductive particles and a thermo- or photo-polymerizable resin layer is layered on the intermediate insulating resin layer can achieve the above-described object of the present invention. The present invention has thus been completed.

The present invention provides an anisotropic conductive film having a first insulating resin layer, a second insulating resin layer, and a third insulating resin layer that are layered in sequence, wherein the first insulating resin layer is formed of a photopolymerized resin, the second insulating resin layer and the third insulating resin layer are each formed of a thermo-cationically or thermo-anionically polymerizable resin, a photo-cationically or photo-anionically polymerizable resin, a thermo-radically polymerizable resin, or a photo-radically polymerizable resin, and the first insulating resin layer has conductive particles for anisotropic conductive connection arranged in a single layer on a surface thereof on a side of the second insulating resin layer. Hereinafter, this anisotropic conductive film is referred to as first anisotropic conductive film.

In the first anisotropic conductive film, it is preferable that the second insulating resin layer and the third insulating resin layer be a thermally polymerizable resin layer using a thermal polymerization initiator that initiates a polymerization reaction by heating. The second insulating resin layer and the third insulating resin layer may be a photopolymerizable resin layer using a photopolymerization initiator that initiates a polymerization reaction by light. The second insulating resin layer and the third insulating resin layer may be a thermo- and photo-polymerizable resin layer using a thermal polymerization initiator and a photopolymerization initiator in combination.

The present invention provides a production method of the above-described first anisotropic conductive film, including the following steps (A) to (D):

Step (A)

a step of disposing conductive particles in a single layer on a photopolymerizable resin layer;

Step (B)

a step of irradiating the photopolymerizable resin layer having the disposed conductive particles with ultraviolet light to cause a photopolymerization reaction, thereby forming the first insulating resin layer in which the conductive particles are fixed in a surface thereof;

Step (C)

a step of layering the second insulating resin layer that is formed of a thermo-cationically or thermo-anionically polymerizable resin, a photo-cationically or photo-anionically polymerizable resin, a thermo-radically polymerizable resin, or a photo-radically polymerizable resin on the surface of the first insulating resin layer on the side of the conductive particles; and Step (D)

a step of layering the third insulating resin layer that is formed of a thermo-cationically or thermo-anionically polymerizable resin, a photo-cationically or photo-anionically polymerizable resin, a thermo-radically polymerizable resin, or a photo-radically polymerizable resin on a surface of the second insulating resin layer, wherein the step (D) is performed before or after the step (C).

The present invention further provides a connection structure in which a first electronic component and a second electronic component are connected by anisotropic conduction through the above-described first anisotropic conductive film.

The present invention provides an anisotropic conductive film having a first insulating resin layer, an intermediate insulating resin layer, and a second insulating resin layer that are layered in sequence, wherein the first insulating resin layer is formed of a photopolymerized resin, the second insulating resin layer is formed of a thermo-cationically or thermo-anionically polymerizable resin, a photo-cationically or photo-anionically polymerizable resin, a thermo-radically polymerizable resin, or a photo-radically polymerizable resin, the intermediate insulating resin layer is formed of a resin containing no polymerization initiator, the first insulating resin layer has conductive particles for anisotropic conductive connection arranged in a single layer on a surface thereof on a side of the second insulating resin layer, and the conductive particles are in contact with the intermediate insulating resin layer.

Hereinafter, this anisotropic conductive film is referred to as second anisotropic conductive film.

In the second anisotropic conductive film, it is preferable that the second insulating resin layer be a thermally polymerizable resin layer using a thermal polymerization initiator that initiates a polymerization reaction by heating. The second insulating resin layer may be a photopolymerizable resin layer using a photopolymerization initiator that initiates a polymerization reaction by light. The second insulating resin layer may be a thermo- and photo-polymerizable resin layer using a thermal polymerization initiator and a photopolymerization initiator in combination.

The present invention provides a production method of the above-described second anisotropic conductive film, including the following steps [A] to [D]:

Step [A]

a step of disposing conductive particles in a single layer on a photopolymerizable resin layer;

Step [B]

a step of irradiating the photopolymerizable resin layer having the disposed conductive particles with ultraviolet light to cause a photopolymerization reaction, thereby forming the first insulating resin layer in which the conductive particles are fixed in a surface thereof;

Step [C]

a step of forming the second insulating resin layer that is formed of a thermo-cationically or thermo-anionically polymerizable resin, a photo-cationically or photo-anionically polymerizable resin, a thermo-radically polymerizable resin, or a photo-radically polymerizable resin; and Step [D]

a step of forming the intermediate insulating resin layer formed of a resin containing no polymerization initiator on a surface of the first insulating resin layer on a side of the conductive particles, wherein (i) the step [D] is performed after the step [B] to form the intermediate insulating resin layer on the surface of the first insulating resin layer on the side of the conductive particles, and the intermediate insulating resin layer and the second insulating resin layer formed in the step [C] are then layered, or (ii) the intermediate insulating resin layer formed of the resin containing no polymerization initiator is formed on the second insulating resin layer formed in the step [C], and the intermediate insulating resin layer is layered on the surface of the first insulating resin layer formed in the step [B] on the side of the conductive particles.

The present invention further provides a connection structure in which a first electronic component and a second electronic component are connected by anisotropic conduction through the aforementioned second anisotropic conductive film.

Advantageous Effects of Invention

The first anisotropic conductive film and the second anisotropic conductive film of the present invention have the first insulating resin layer (photopolymerized resin) obtained by photopolymerization of a photopolymerizable resin layer, and the second insulating resin layer that is layered on a surface of the first insulating resin layer and is polymerized by heat or light. In addition, the conductive particles for anisotropic conductive connection are disposed in a single layer on the surface of the first insulating resin layer on the side of the second insulating resin layer. Thus, the conductive particles can be firmly fixed by the first insulating resin layer that is photopolymerized.

When a photopolymerizable resin is irradiated with ultraviolet light from the side of the conductive particles for photopolymerization in the formation of the first insulating resin layer, the photopolymerizable resin layer under (on the back side of) the conductive particles is not sufficiently irradiated with ultraviolet light due to shadow of the conductive particles. Therefore, the curing ratio in a region that is shadowed by the conductive particles in the photopolymerized resin formed by irradiation is lower than that in a region that is not shadowed. The conductive particles are thus favorably pushed during anisotropic conductive connection. Accordingly, in the first anisotropic conductive film and the second anisotropic conductive film of the present invention, favorable conduction reliability and insulating properties (low short circuit occurrence ratio) can be achieved.

In the first anisotropic conductive film of the present invention, not only the second insulating resin layer but also the third insulating resin layer are layered on the first insulating resin layer having the disposed conductive particles. Therefore, a stress generated during using the anisotropic conductive film of the present invention for anisotropic conductive connection is relaxed. Thus, a warping in a connection structure anisotropically conductively connected can be decreased.

In contrast, in the second anisotropic conductive film, the intermediate insulating resin layer is provided around the conductive particles. This intermediate insulating resin layer relaxes a stress applied to the conductive particles during winding, unwinding, and conveying the anisotropic conductive film, and unrolling the film at an anisotropic conductive connection process. Accordingly, in the anisotropic conductive film of the present invention, favorable conductive particle capture ratio and conduction reliability, and low short circuit occurrence ratio can be achieved.

In the first anisotropic conductive film and the second anisotropic conductive film, when the photopolymerizable resin is irradiated with ultraviolet light from a side opposite to the conductive particles or both surfaces in the formation of the first insulating resin layer, fixation of the conductive particles is promoted. For this reason, stable quality can be secured at a production line of the anisotropic conductive films. Even when an unnecessary external stress is applied to the anisotropic conductive film at processes of winding the produced anisotropic conductive films on a reel and unrolling the films from the reel during anisotropic conductive connection, the external stress hardly affects the arrangement of the conductive particles before anisotropic conductive connection.

When the second insulating resin layer or the third insulating resin layer in the first anisotropic conductive film is formed of a polymerizable resin to be reacted by heat and the second insulating resin layer in the second anisotropic conductive film is formed of a polymerizable resin to be reacted by heat, anisotropic conductive connection of electronic components using the anisotropic conductive film can be performed in the same manner as a general connection method using the anisotropic conductive film.

On the other hand, when the second insulating resin layer or the third insulating resin layer in the first anisotropic conductive film is formed of a polymerizable resin to be reacted by light and the second insulating resin layer in the second anisotropic conductive film is formed of a polymerizable resin to be reacted by light, anisotropic conductive connection of a first electronic component and a second electronic component using the anisotropic conductive film may be performed by pushing by a connection tool before a photoreaction is completed. In this case, the connection tool or the like may be heated to promote resin flow and particle pushing. Even when the polymerizable resin to be reacted by heat and the polymerizable resin to be reacted by light are used in combination in the second insulating resin layer or the third insulating resin layer, pushing by the connection tool may be performed before a photoreaction is completed in the same manner as described above and heating may be performed.

When the first electronic component and the second electronic component are connected by anisotropic conduction using the first anisotropic conductive film or the second anisotropic conductive film utilizing a photoreaction, the film may be irradiated with light from a side of the electronic component that has light transparency.

DESCRIPTION OF EMBODIMENTS

Figure 1:
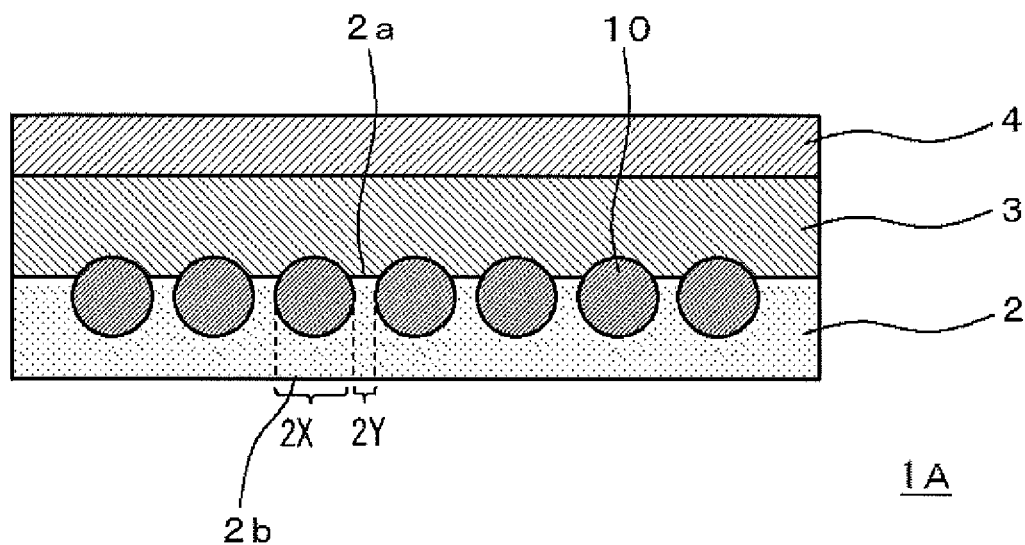
FIG. 1 is a cross-sectional view of a first anisotropic conductive film of the present invention.

Hereinafter, examples of the anisotropic conductive film of the present invention will be described in detail with reference to the drawings. In the drawings, the same reference numerals denote the same or similar elements.

<<First Anisotropic Conductive Film>>

FIG. 1 is a cross-sectional view of a first anisotropic conductive film 1A that is an embodiment of the present invention. In the first anisotropic conductive film 1A, a first insulating resin layer 2, a second insulating resin layer 3, and a third insulating resin layer 4 are layered in sequence, and conductive particles 10 for anisotropic conductive connection are disposed in a single layer on a surface 2a of the first insulating resin layer 2 on a side of the second insulating resin layer 3.

<First Insulating Resin Layer>

The first insulating resin layer 2 constituting the first anisotropic conductive film 1A is formed of a photopolymerized resin. Specifically, the first insulating resin layer is formed by photo-radically polymerizing a photo-radically polymerizable resin layer containing an acrylate compound and a photo-radical polymerization initiator. Since the first insulating resin layer 2 is photopolymerized, the conductive particles 10 can be appropriately fixed. Therefore, even when the first anisotropic conductive film 1A is heated during anisotropic conductive connection, the first insulating resin layer 2 is unlikely to flow. Accordingly, the occurrence of short circuit due to unnecessarily flowed conductive particles 10 caused by resin flow can be largely suppressed.

In the first anisotropic conductive film 1A of this embodiment, it is particularly preferable that the curing ratio in a region 2X of the first insulating resin layer 2 where the conductive particles 10 are present on the side of the second insulating resin layer 3 (i.e., a region between the conductive particles 10 and an outer surface 2b of the first insulating resin layer 2) be lower than that in a region 2Y of the first insulating resin layer 2 where the conductive particles 10 are not present. In the region 2X of the first insulating resin layer 2, the acrylate compound and the photo-radical polymerization initiator in which light curing does not proceed may remain. When the first anisotropic conductive film 1A has such a region 2X, an insulating resin in the region 2X is easy to be removed during anisotropic conductive connection. Therefore, the conductive particles 10 are unlikely to move in a plane direction of the first insulating resin layer 2, but are favorably pushed in a thickness direction. Accordingly, the conductive particle capture ratio can be improved, and the connection reliability and the insulating properties can also be improved.

The curing ratio herein represents a value defined as a decrease ratio of a vinyl group. The curing ratio in the region 2X of the first insulating resin layer is preferably 40 to 80%, and the curing ratio in the region 2Y is preferably 70 to 100%.

In order to stabilize the quality of product of the first anisotropic conductive film 1A, it is preferable that a difference between the curing ratio in the region 2X and that in the region 2Y be reduced or substantially eliminated. Accordingly, the difference between the curing ratio in the region 2X and that in the region 2Y is controlled by balance of improved conductive particle capture ratio and stability of the product quality.

(Acrylate Compound)

As an acrylate compound that is an acrylate unit, a conventionally known photopolymerizable acrylate can be used. For example, a monofunctional (meth)acrylate (herein, (meth)acrylate includes acrylate and methacrylate), or a multifunctional (meth)acrylate having two or more functional groups can be used. In the present invention, in order to thermally cure the insulating resin layer during anisotropic conductive connection, it is preferable that a multifunctional (meth)acrylate be used for at least a portion of an acrylic monomer.

When the content of the acrylate compound in the first insulating resin layer 2 is too small, a difference between the viscosity of the first insulating resin layer 2 and that of the second insulating resin layer 3 during anisotropic conductive connection tends not to be produced. When the content thereof is too large, the curing shrinkage tends to increase and the workability tends to decrease. Therefore, the content is preferably 2 to 70% by mass, and more preferably 10 to 50% by mass.

(Polymerization Initiator)

As the photopolymerization initiator used in the formation of the first insulating resin layer, a publicly known photo-radical polymerization initiator and the like can be appropriately selected and used. Specific examples of the publicly known photo-radical polymerization initiator may include an acetophenone-based photopolymerization initiator, a benzylketal-based photopolymerization initiator, and a phosphorus-based photopolymerization initiator.

In addition to the photo-radical polymerization initiator, a thermal radical polymerization initiator may be used. Examples of the thermal radical polymerization initiator may include an organic peroxide and an azo-based compound. An organic peroxide that does not generate nitrogen causing bubbles can be preferably used.

When the amount of the photopolymerization initiator to be used is too small relative to 100 parts by mass of the acrylate compound, photopolymerization does not sufficiently proceed. When the amount is too large, stiffness may decrease. Therefore, the amount is preferably 0.1 to 25 parts by mass, and more preferably 0.5 to 15 parts by mass.

(Other Resin and Polymerization Initiator)

If necessary, the first insulating resin layer 2 may further contain an epoxy compound, a thermal cationic or thermal anionic polymerization initiator, or a photo-cationic or photo-anionic polymerization initiator. Thus, the delamination strength can be improved. The polymerization initiator used with the epoxy compound will be described in the second insulating resin layer 3. In the first insulating resin layer 2, if necessary, a film-forming resin such as a phenoxy resin, an unsaturated polyester resin, a saturated polyester resin, a urethane resin, a butadiene resin, a polyimide resin, a polyamide resin, or a polyolefin resin can also be used in combination.

<Thickness of First Insulating Resin Layer>

When the thickness of the first insulating resin layer 2 is too small, the conductive particle capture ratio tends to decrease. When the thickness is too large, the conduction resistance tends to increase. Therefore, the thickness is preferably 1.0 to 6.0 μm, and more preferably 2.0 to 5.0 μm.

(Photopolymerization of First Insulating Resin Layer)

The first insulating resin layer 2 can be formed, for example, by attaching the conductive particles in a single layer to a photopolymerizable resin layer containing a photo-radically polymerizable resin and a photo-radical polymerization initiator by a procedure such as a film transfer method, a mold transfer method, an inkjet method, and an electrostatic attachment method, and irradiating the photopolymerizable resin layer with ultraviolet light from a side of the conductive particles to cause photopolymerization. When the layer is irradiated with ultraviolet light from the side of the conductive particles, the curing ratio in the region 2X of the first insulating resin layer can be made lower than that in the region 2Y. The conductive particle capture ratio can thus be improved.

On the other hand, a photopolymerizable resin forming the first insulating resin layer 2 may be irradiated with ultraviolet light from a side opposite to the conductive particles 10. Thus, a difference between the curing ratio in the region 2X and that in the region 2Y in the first insulating resin layer is substantially eliminated. As a result, light curing of the first insulating resin layer 2 proceeds. For this reason, stable quality can be secured at a production line of the anisotropic conductive film. When the anisotropic conductive film is formed in an elongated form and wound on a reel, pressures applied to the conductive particles 10 from a winding start to a winding end can be made substantially the same, and the arrangement of the conductive particles 10 can be prevented from being disordered.

Photopolymerization may be performed in a single step (that is, irradiation with light once), or in two steps (that is, irradiation with light two times). When photopolymerization is performed in two steps, it is preferable that the layer be irradiated with ultraviolet light only from the side of the conductive particles. This is because the curing ratio in the region 2X of the first insulating resin layer is lower than that in the region 2Y and the capture ratio of the conductive particles 10 is improved. On the other hand, the layer may be irradiated with light in a first step from the side of the conductive particles 10, and irradiated with light in a second step from a side opposite to the side in order to stabilize the quality. In this case, after formation of the second insulating resin layer 3 on a surface of the first insulating resin layer 2, the first insulating resin layer 2 may be irradiated with light in the second step from a side of another surface of the first insulating resin layer 2 under an oxygen-containing atmosphere (in the air). In the irradiation with light in the second step, the irradiation intensity may be adjusted so that the curing ratio in the region 2X is lower than that in the region 2Y, or a mask may be used.

When photopolymerization is performed in two steps, the curing ratio in the region 2X of the first insulating resin layer in the first step is preferably 10 to 50%, the curing ratio in the second step is preferably 40 to 80%, the curing ratio in the region 2Y in the first step is preferably 30 to 90%, and the curing ratio in the second step is preferably 70 to 100%.

When photopolymerization is performed in two steps, only one kind of the polymerization initiator may be used. It is preferable, however, that two kinds of photopolymerization initiators having different wavelength ranges that initiate a reaction be used in order to improve the tackiness. For example, it is preferable that IRGACURE 369 (BASF Japan Ltd.) that initiates a radical reaction by light having a wavelength of 365 nm from an LED light source and IRGACURE 2959 (BASF Japan Ltd.) that initiates a radical reaction by light from a light source of a high pressure mercury lamp be used in combination. When two kinds of different photopolymerization initiators are thus used, bonding of the resin is complicated. As a result, behavior of thermal flow of the resin during anisotropic conductive connection can be finely controlled.

It is preferable that the lowest melt viscosity of the first insulating resin layer 2 after photopolymerization be higher than that of the second insulating resin layer 3. Specifically, a value of [the lowest melt viscosity of the first insulating resin layer 2 (mPa·s)]/[the lowest melt viscosity of the second insulating resin layer 3 (mPa·s)] that are measured by a rheometer is preferably 1 to 1,000, and more preferably 4 to 400. The lowest melt viscosity of the first insulating resin layer 2 is preferably 100 to 100,000 mPa·s, and more preferably 500 to 50,000 mPa·s. The lowest melt viscosity of the second insulating resin layer 3 is preferably 0.1 to 10,000 mPa·s, and more preferably 0.5 to 1,000 mPa·s.

<Conductive Particles>

As the conductive particles 10, conductive particles used in conventionally known anisotropic conductive films can be appropriately selected and used. Examples of the conductive particles may include metal particles such as nickel, cobalt, silver, copper, gold, and palladium particles, and metal-coated resin particles. Two or more kinds thereof may be used in combination.

When the average particle diameter of the conductive particles is too small, the variation of heights of wirings cannot be absorbed, and the resistance tends to increase. When the average particle diameter is too large, short circuit tends to occur. Therefore, the average particle diameter is preferably 1 μm to 10 μm, and more preferably 2 μm to 6 μm.

When the amount of such conductive particles in the first insulating resin layer 2 is too small, the capture number of conductive particles decreases, and the anisotropic conductive connection is difficult. When the amount is too large, short circuit may occur. Therefore, the amount is preferably 50 to 50,000, and more preferably 200 to 30,000 per square millimeter.

It is preferable that the positions of the conductive particles 10 in the thickness direction of the first insulating resin layer 2 be not a position in which the conductive particles 10 are embedded in the first insulating resin layer 2 but a position in which the conductive particles 10 eat into the second insulating resin layer 3, as shown in FIG. 1. When the conductive particles 10 are embedded in the first insulating resin layer 2, the conductive particles are ununiformly pushed for anisotropic conductive connection. Thus, the conduction resistance of a connection structure anisotropically conductively connected to electronic components may increase. In terms of balance of the conductive particle capture ratio and the conduction resistance, a degree of eating-into is preferably 10 to 90%, and more preferably 20 to 80% of the average particle diameter of the conductive particles 10.

<Second Insulating Resin layer, Third Insulating Resin Layer>

The second insulating resin layer 3 and the third insulating resin layer 4 are each formed of a thermo-cationically or thermo-anionically polymerizable resin, a photo-cationically or photo-anionically polymerizable resin, a thermo-radically polymerizable resin, or a photo-radically polymerizable resin. Specifically, the second insulating resin layer 3 and the third insulating resin layer 4 each include a polymerizable resin layer that contains an epoxy compound and a thermal cationic or thermal anionic polymerization initiator or a photo-cationic or photo-anionic polymerization initiator and is to be polymerized by heat or light or a polymerizable resin layer that contains an acrylate compound and a thermal radical or photo-radical polymerization initiator and is to be radically polymerized by heat or light.

It is preferable that the amount of the polymerizable resin in the second insulating resin layer 3 be made larger than that in the third insulating resin layer 4 in terms of stress relaxation after anisotropic conductive connection.

In order to allow the third insulating resin layer 4 to function as a tack layer during anisotropic conductive connection, the third insulating resin layer 4 may contain an additive in an amount of 10% by mass or less.

If necessary, a tack layer may be provided on a surface of the first insulating resin layer 2 opposite to the second insulating resin layer 3.

(Epoxy Compound)

As the epoxy compound forming the second insulating resin layer 3 or the third insulating resin layer 4, a compound or a resin having two or more epoxy groups in the molecule may preferably be mentioned. The compound and the resin may be liquid or solid.

(Thermal Cationic Polymerization Initiator)

As the thermal cationic polymerization initiator forming the second insulating resin layer 3 or the third insulating resin layer 4, a publicly known thermal cationic polymerization initiator for an epoxy compound can be used. For example, a iodonium salt, sulfonium salt, phosphonium salt, or ferrocenes that generates an acid by heat can be used. An aromatic sulfonium salt that exhibits favorable latency for temperature can be particularly preferably used.

When the amount of the thermal cationic polymerization initiator to be added is too small, curing tends to be difficult. When the amount is too large, the product life tends to be reduced. Therefore, the amount is preferably 2 to 60 parts by mass, and more preferably 5 to 40 parts by mass, relative to 100 parts by mass of the epoxy compound.

(Thermal Anionic Polymerization Initiator)

As the thermal anionic polymerization initiator forming the second insulating resin layer 3 or the third insulating resin layer 4, a publicly known thermal anionic polymerization initiator for an epoxy compound can be used. For example, an aliphatic amine-based compound, aromatic amine-based compound, secondary or tertiary amine-based compound, imidazole-based compound, polymercaptan-based compound, boron trifluoride-amine complex, dicyandiamide, or organic acid hydrazide that generates a base by heat can be used. An encapsulated imidazole-based compound that exhibits favorable latency for temperature can be particularly preferably used.

When the amount of the thermal anionic polymerization initiator to be added is too small, curing tends to be difficult. When the amount is too large, the product life tends to be reduced. Therefore, the amount is preferably 2 to 60 parts by mass, and more preferably 5 to 40 parts by mass, relative to 100 parts by mass of the epoxy compound.

(Photo-Cationic Polymerization Initiator and Photo-Anionic Polymerization Initiator)

As the photo-cationic polymerization initiator or the photo-anionic polymerization initiator for an epoxy compound, a publicly known polymerization initiator can be appropriately used.

(Acrylate Compound)

As the acrylate compound forming the second insulating resin layer 3 or the third insulating resin layer 4, the acrylate compound described in relation to the first insulating resin layer 2 can be appropriately selected and used.

(Thermal Radical Polymerization Initiator)

As the thermal radical polymerization initiator used with an acrylate compound when the second insulating resin layer 3 or the third insulating resin layer 4 contains the acrylate compound, the thermal radical polymerization initiator described in relation to the first insulating resin layer 2 can be appropriately selected and used.

When the amount of the thermal radical polymerization initiator to be used is too small, curing is difficult. When the amount is too large, the product life is reduced. Therefore, the amount is preferably 2 to 60 parts by mass, and more preferably 5 to 40 parts by mass, relative to 100 parts by mass of the acrylate compound.

(Photo-Radical Polymerization Initiator)

As the photo-radical polymerization initiator for an acrylate compound, a publicly known photo-radical polymerization initiator can be used.

When the amount of the photo-radical polymerization initiator to be used is too small, curing is difficult. When the amount is too large, the product life is reduced. Therefore, the amount is preferably 2 to 60 parts by mass, and more preferably 5 to 40 parts by mass, relative to 100 parts by mass of the acrylate compound.

(Thicknesses of Second Insulating Resin layer and Third Insulating Resin layer)

The thickness of the second insulating resin layer 3 is preferably 3 to 20 μm, and more preferably 5 to 15 μm in terms of conductive particle capture properties after anisotropic connection.

In order to facilitate control of pressing, it is preferable that the thickness of the third insulating resin layer 4 be ½ or less of that of the second insulating resin layer 3.

<<Method for Producing First Anisotropic Conductive Film>>

The first anisotropic conductive film can be produced by performing the following steps (A) to (D).

Step (A)

Figure 2:
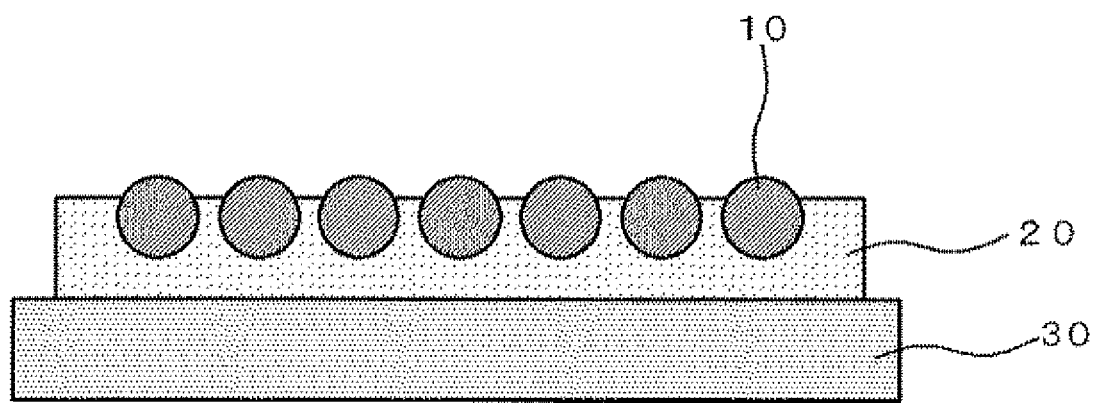
FIG. 2 is an explanatory diagram of a step (A) in a production method of the first anisotropic conductive film of the present invention.

As shown in FIG. 2, the conductive particles 10 are arranged in a single layer on a photopolymerizable resin layer 20 that is formed on a release film 30, if necessary. A procedure of arranging the conductive particles 10 in a single layer in the photopolymerizable resin layer 20 is not particularly limited. A method using a biaxial stretching operation for a resin film to which conductive particles are fixed with an adhesive as described in Example 1 of Japanese Patent No. 4789738, a method using a mold in Japanese Patent Application Laid-Open No. 2010-33793, or other methods may be used. It is preferable that the conductive particles 10 be arranged at predetermined intervals lengthwise and crosswise. In consideration of the size, conduction reliability, insulating properties, and conductive particle capture ratio of a connection subject, the conductive particles are preferably arranged so as to be two-dimensionally apart about 1 to about 100 μm from each other.

Step (B)

Figure 3A:
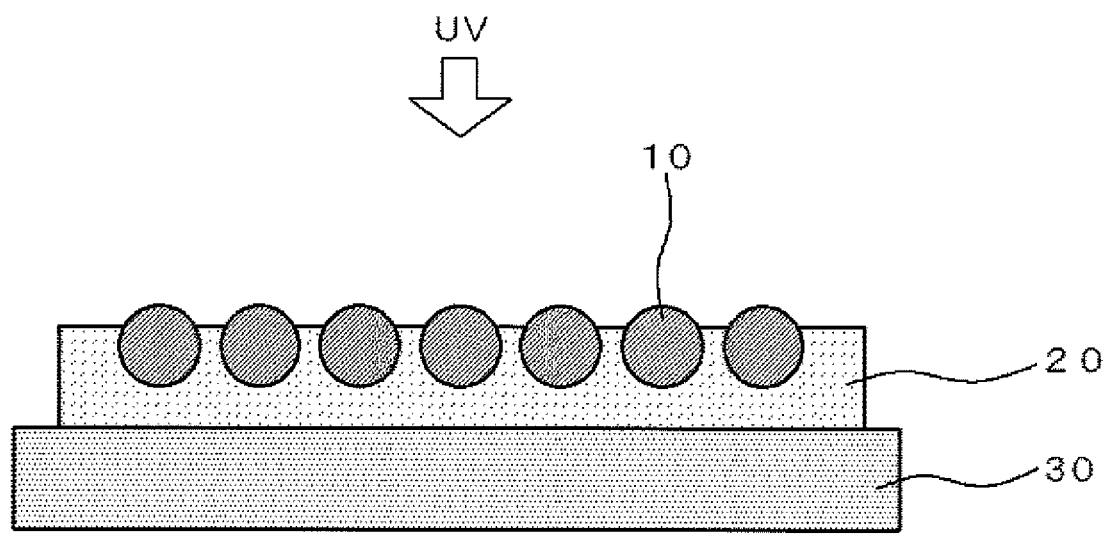
FIG. 3A is an explanatory diagram of a step (B) in the production method of the first anisotropic conductive film of the present invention.
Figure 3B:
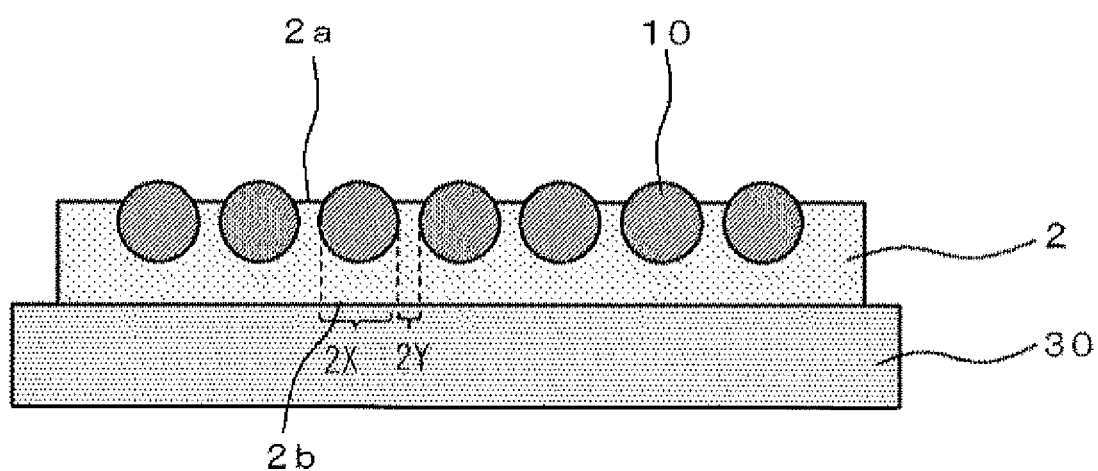
FIG. 3B is an explanatory diagram of the step (B) in the production method of the first anisotropic conductive film of the present invention.

As shown in FIG. 3A, the photopolymerizable resin layer 20 having the disposed conductive particles 10 is irradiated with ultraviolet light (UV) from the side of the conductive particles 10 to cause a photopolymerization reaction, whereby the first insulating resin layer 2 in which the conductive particles 10 are fixed in a surface is formed. As shown in FIG. 3B, the curing ratio in the region 2X where the conductive particles 10 are present on a side of the second insulating resin layer 3 in the first insulating resin layer 2 (a region between a surface 2b of the first insulating resin layer 2 on a side of the release film 30 and the conductive particles 10) can be made lower than that in the region 2Y where the conductive particles 10 are not present in the first insulating resin layer 2. Therefore, pushing of the conductive particles 10 during anisotropic conductive connection can be facilitated and the flow of the conductive particles 10 in a connection plane direction can be suppressed.

Step (C)

Figure 4A:
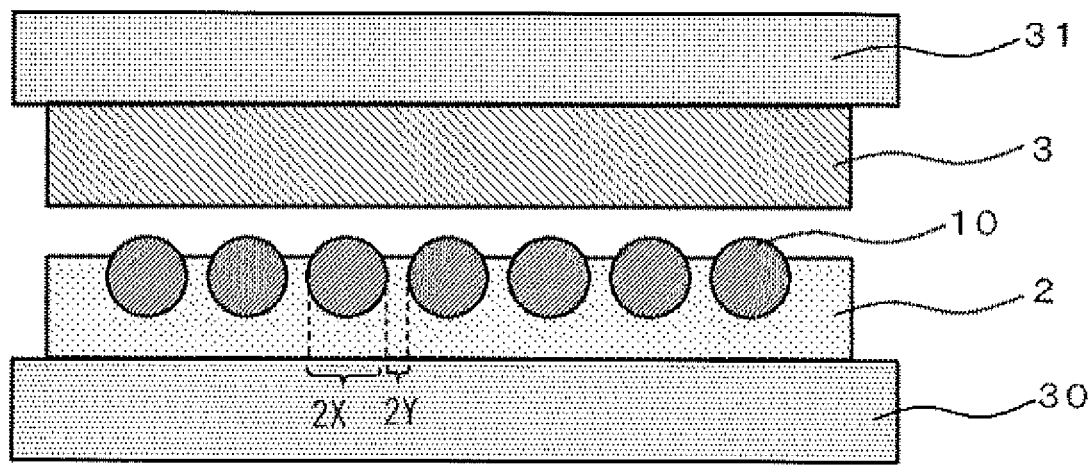
FIG. 4A is an explanatory diagram of a step (C) in the production method of the first anisotropic conductive film of the present invention.
Figure 4B:
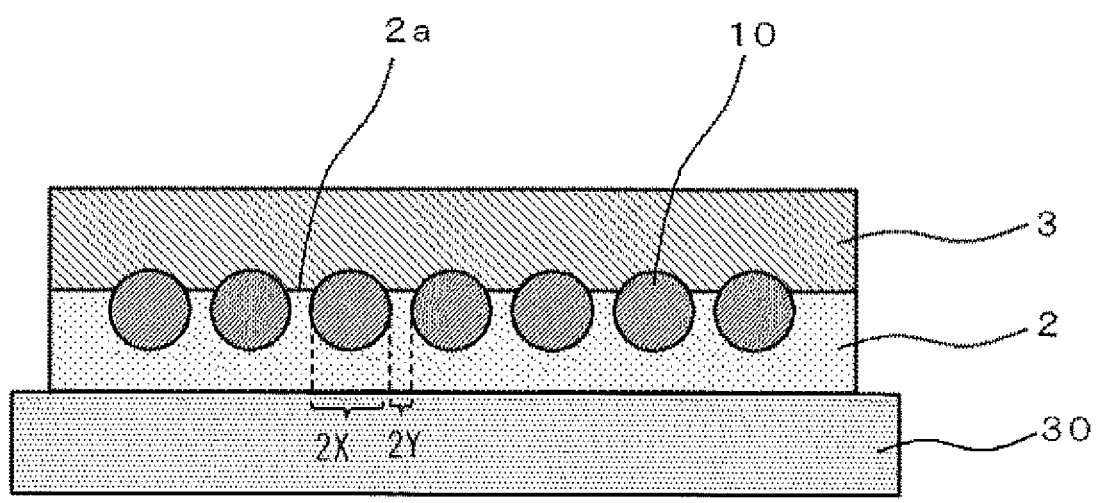
FIG. 4B is an explanatory diagram of the step (C) in the production method of the first anisotropic conductive film of the present invention.

As shown in FIG. 4A, the second insulating resin layer 3 that is formed of a thermo-cationically or thermo-anionically polymerizable resin, a photo-cationically or photo-anionically polymerizable resin, a thermo-radically polymerizable resin, or a photo-radically polymerizable resin is layered on the surface of the first insulating resin layer 2 on the side of the conductive particles 10. Specifically, the second insulating resin layer 3 formed on a release film 31 by an ordinary method is disposed on the surface of the first insulating resin layer 2 on the side of the conductive particles 10 and thermocompression-bonded so as not to cause excessive thermal polymerization. The release film 31 is removed. Thus, the anisotropic conductive film of FIG. 4B can be obtained.

Step (D)

Figure 5:
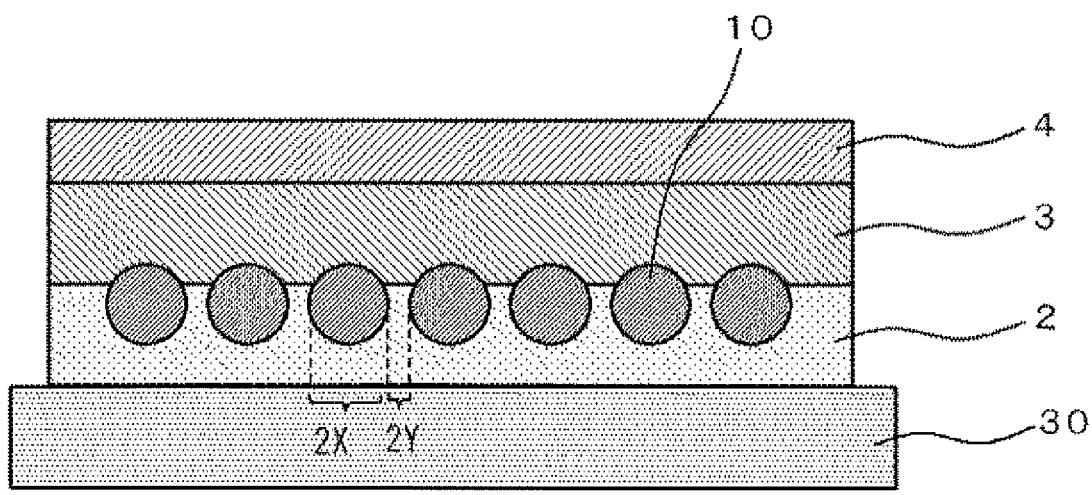
FIG. 5 is an explanatory diagram of a step (D) in the production method of the first anisotropic conductive film of the present invention. This is a cross-sectional view of the first anisotropic conductive film of the present invention.

As shown in FIG. 5, the third insulating resin layer 4 that is formed of a thermo-cationically or thermo-anionically polymerizable resin, a photo-cationically or photo-anionically polymerizable resin, a thermo-radically polymerizable resin, or a photo-radically polymerizable resin is layered on a surface of the second insulating resin layer 3 (that is, a surface opposite to the first insulating resin layer 2). The release film 30 is removed. Thus, the first anisotropic conductive film 1A of FIG. 1 can be obtained.

Figure 6:
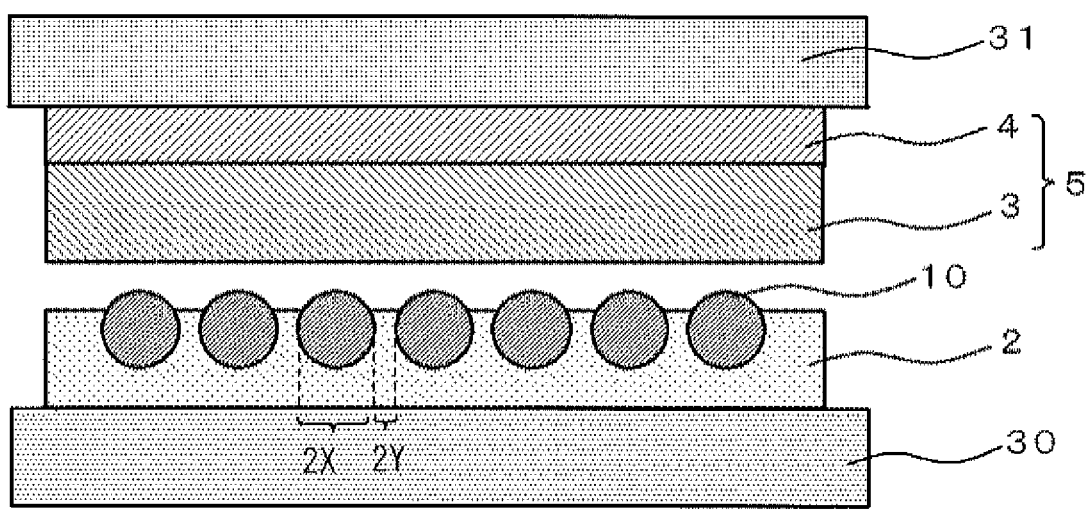
FIG. 6 is an explanatory diagram of the step (D) in the production method of the first anisotropic conductive film of the present invention.

Alternatively, the step (D) is performed before the step (C), as shown in FIG. 6. Specifically, a layered body 5 having the second insulating resin layer 3 and the third insulating resin layer 4 is formed on a release film 31 in advance, the second insulating resin layer 3 of the layered body 5 is layered on a surface of the first insulating resin layer 2 on the side of the conductive particles 10, and the release films 30 and 31 are removed. Thus, the first anisotropic conductive film 1A of FIG. 1 may be obtained.

<<Second Anisotropic Conductive Film>>

Figure 7A:
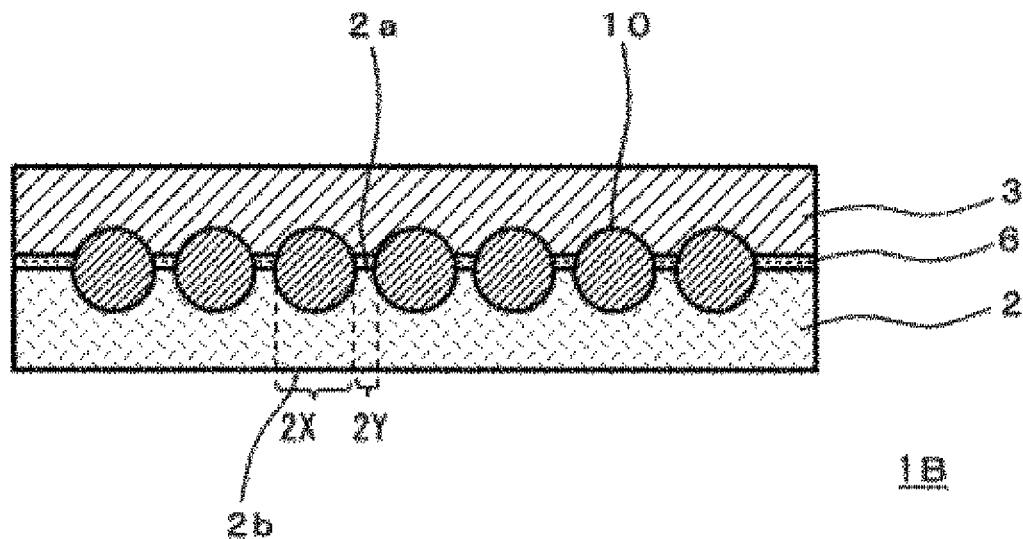
FIG. 7A is a cross-sectional view of a second anisotropic conductive film of the present invention.

FIG. 7A is a cross-sectional view of the second anisotropic conductive film 1B that is an embodiment of the present invention. In the second anisotropic conductive film 1B, a first insulating resin layer 2, an intermediate insulating resin layer 6, and a second insulating resin layer 3 are layered in sequence, and conductive particles 10 for anisotropic conductive connection are disposed in a single layer on a surface 2a of the first insulating resin layer 2 on a side of the second insulating resin layer 3 so as to penetrate at least a surface of the intermediate insulating resin layer 6 on a side of the first insulating resin layer 2, and are in contact with the intermediate insulating resin layer 6.

<First Insulating Resin Layer>

The first insulating resin layer 2 constituting the second anisotropic conductive film 1B is formed of the same photopolymerized resin as that for the first insulating resin layer 2 of the first anisotropic conductive film 1A as described above, and allows the conductive particles 10 to be appropriately fixed.

Similarly to the first anisotropic conductive film 1A, it is preferable that in the second anisotropic conductive film 1B, the curing ratio in the region 2X where the conductive particles 10 are present on the side of the second insulating resin layer 3 in the first insulating resin layer 2 (i.e., a region between the conductive particles 10 and an outer surface 2b of the first insulating resin layer 2) be lower than that in the region 2Y where the conductive particles 10 are not present in the first insulating resin layer 2. Thus, an insulating resin in the region 2X is easy to be removed during anisotropic conductive connection. Therefore, the conductive particles 10 are unlikely to move in a plane direction of the first insulating resin layer 2, but are favorably pushed in a thickness direction. Accordingly, the conductive particle capture ratio can be improved, the connection reliability can be further improved, and the short circuit occurrence ratio can be decreased.

In order to stabilize the quality of product of the second anisotropic conductive film 1B also, it is preferable that a difference between the curing ratio in the region 2X and that in the region 2Y be reduced or substantially eliminated. Accordingly, the difference between the curing ratio in the region 2X and that in the region 2Y is controlled by balance of improved conductive particle capture ratio and stability of the product quality.

<Conductive Particles>

Examples of the conductive particles 10 constituting the second anisotropic conductive film 1B may include metal particles such as nickel, cobalt, silver, copper, gold, and palladium particles, and metal-coated resin particles, similarly to the first anisotropic conductive film 1A. Two or more kinds thereof may be used in combination.

The average particle diameter of the conductive particles 10 and the amount of the particles in the first insulating resin layer 2 are the same as those in the first anisotropic conductive film 1A.

It is preferable that the positions of the conductive particles 10 in the thickness direction of the first insulating resin layer 2 be not a position in which the conductive particles 10 are embedded in the first insulating resin layer 2, but a position in which the conductive particles 10 penetrate the intermediate insulating resin layer 6 and eat into the second insulating resin layer 3, as shown in FIG. 7A. Specifically, the conductive particles 10 in this case are placed over the first insulating resin layer 2 and the second insulating resin layer 3. Since the conductive particles 10 penetrate the intermediate insulating resin layer 6, the deformation of the conductive particles 10 during anisotropic conductive connection can be made uniform, and unwanted shift of the particles can be prevented.

When the conductive particles 10 penetrate the intermediate insulating resin layer 6 and eat into the second insulating resin layer 3, as shown in FIG. 7A, a degree that the conductive particles eat into the intermediate insulating resin layer 6 and the second insulating resin layer 3 (i.e., a degree at which the conductive particles are protruded from the first insulating resin layer 2) is preferably 10 to 90%, and more preferably 20 to 80% of the average particle diameter of the conductive particles 10 in terms of balance of the conductive particle capture ratio and the conduction resistance.

Figure 7B:
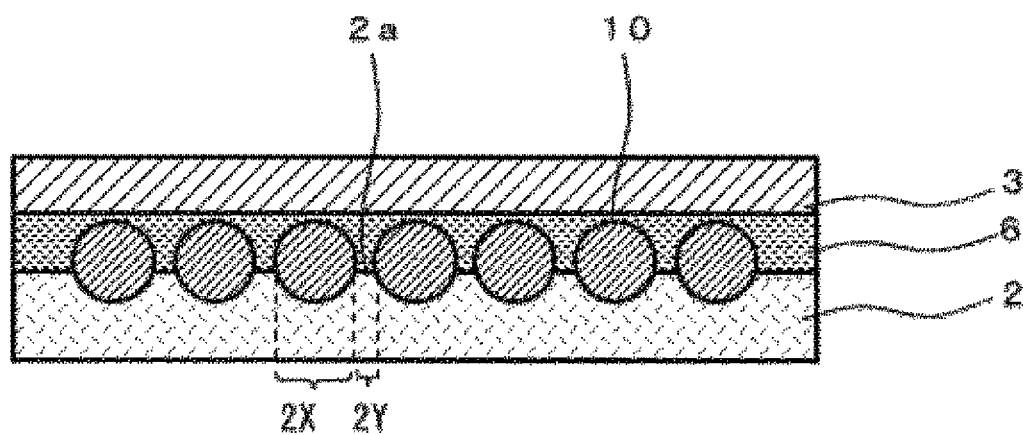
FIG. 7B is a cross-sectional view of a modified aspect of the second anisotropic conductive film of the present invention.

On the other hand, a portion where the conductive particles 10 are protruded from the first insulating resin layer 2 may be covered with the intermediate insulating resin layer 6. For example, the conductive particles 10 may not penetrate the intermediate insulating resin layer 6 and may be placed over the first insulating resin layer 2 and the intermediate insulating resin layer 6, as shown in FIG. 7B. Even when the upper portion of the conductive particles 10 is thus covered with the intermediate insulating resin layer 6, the deformation of the conductive particles 10 is unlikely to be inhibited in pushing during anisotropic conductive connection. In this case, it is preferable that a portion where the conductive particles 10 are protruded to a side of the first insulating resin layer 2 be 20% or less, and more preferably 10% or less of the particle diameters of the conductive particles.

Figure 7C:
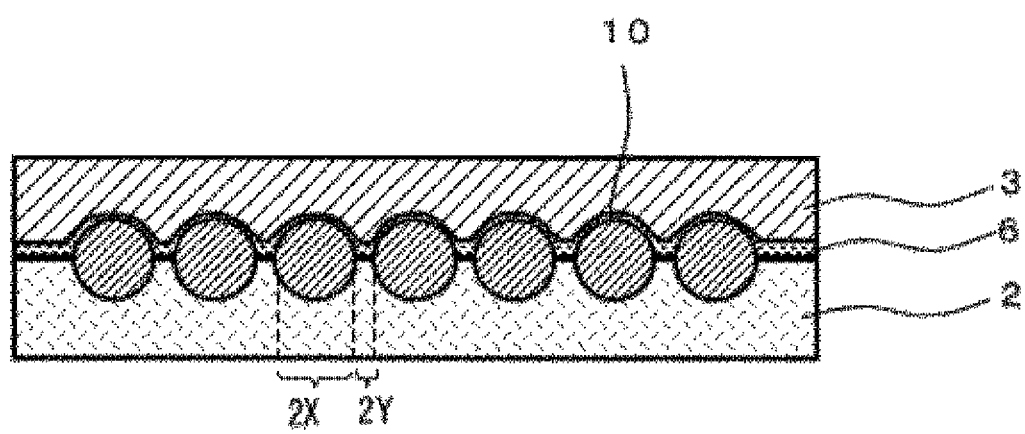
FIG. 7C is a cross-sectional view of a modified aspect of the second anisotropic conductive film of the present invention.

In an aspect in which the portion where the conductive particles 10 are protruded from the first insulating resin layer 2 is covered with the intermediate insulating resin layer 6, the conductive particles 10 that are protruded from the first insulating resin layer 2 may be covered with the intermediate insulating resin layer 6 having a thickness smaller than the particle diameters of the conductive particles along protrusions of the conductive particles 10, as shown in FIG. 7C. In the aspect of FIG. 7C, the intermediate insulating resin layer 6 may be provided so as to follow shapes of the conductive particles 10. Therefore, the inhibition of deformation of the conductive particles 10 in pushing during anisotropic conductive connection can be finely controlled.

In contrast, when the conductive particles 10 are embedded in the first insulating resin layer 2, the deformation of the conductive particles 10 is inhibited during anisotropic conductive connection of electronic components, and as a result, pushing may be made nonuniform. This is not preferred.

<Intermediate Insulating Resin Layer>

The intermediate insulating resin layer 6 is provided as a layer that relaxes a stress applied to the conductive particles 10 during winding, unwinding, and conveying the second anisotropic conductive film 1B, and unrolling the film at an anisotropic conductive connection process. The intermediate insulating resin layer 6 is provided around the conductive particles 10, and a stress accumulated in the conductive particles 10 is relaxed. Therefore, shift of positions of the conductive particles in a connection plane direction due to resin flow and compression of the conductive particles 10 during anisotropic conductive connection can be suppressed. Accordingly, in the second anisotropic conductive film 1B of the present invention, favorable conductive particle capture ratio and conduction reliability, and low short circuit occurrence ratio can be achieved.

The thickness of the intermediate insulating resin layer 6 is preferably 1.2 times or less, more preferably 1 time or less, and further preferably 0.7 times or less the particle diameters of the conductive particles 10. When the thickness falls within this range, problems in terms of quality stability, such as nonuniform deformation during pushing of the conductive particles 10 in anisotropic conductive connection and difficulty in capturing of the conductive particles at a bump terminal are unlikely to arise. When the anisotropic conductive film that is elongated is wound on a reel or the like, pressures applied to the conductive particles can be made homogeneous, and the arrangement of the conductive particles can be prevented from being disordered. In order to make a production condition simpler, the intermediate insulating resin layer 6 may have a thickness substantially the same as those of the conductive particles 10.

In order to easily absorb the stress applied to the conductive particles during anisotropic conductive connection, the intermediate insulating resin layer 6 is formed of a resin containing no polymerization initiator. It is preferable that the resin forming the intermediate insulating resin layer 6 have the same elastic modulus as that of a resin component of other layers. The resin may be a polymerizable resin. For example, a phenoxy resin, an epoxy resin, a polyolefin resin, a polyurethane resin, an acrylic resin, or the like, can be used.

Since the unnecessary flow of conductive particles 10 during anisotropic conductive connection is effectively suppressed, it is preferable that the intermediate insulating resin layer 6 contain a filler such as silica. The content of filler in the intermediate insulating resin layer 6 is preferably 0.5 to 20% by mass.

<Second Insulating Resin Layer>

The second insulating resin layer 3 of the second anisotropic conductive film 1B is formed of a thermo-cationically or thermo-anionically polymerizable resin, a photo-cationically or photo-anionically polymerizable resin, a thermo-radically polymerizable resin, or a photo-radically polymerizable resin, similarly to the second insulating resin layer 3 of the first anisotropic conductive film LA.

The thickness of the second insulating resin layer 3 is preferably 3 to 20 µm, and more preferably 5 to 15 µm in terms of conductive particle capture properties during anisotropic conductive connection.

<<Production. Method of Second Anisotropic Conductive Film>>

The second anisotropic conductive film 1B can be produced by performing the following steps [A] to [D].

Step [A]

Figure 8:
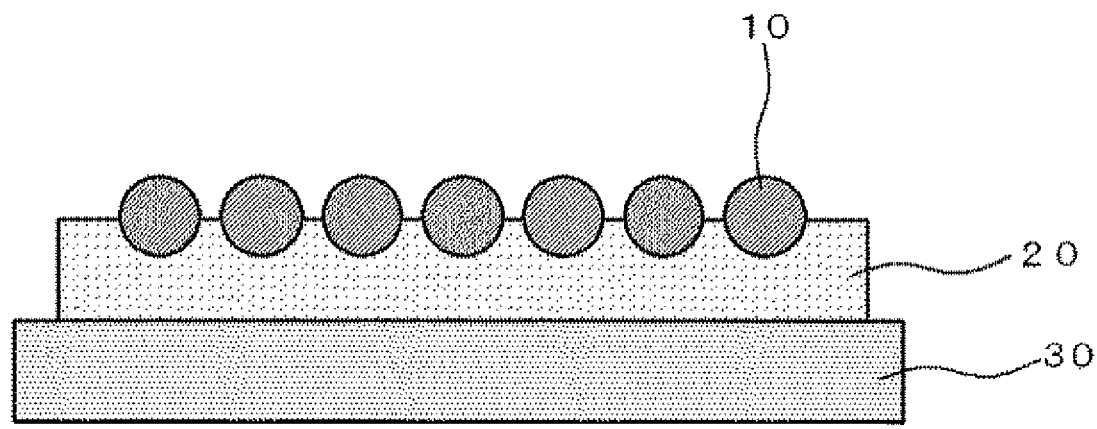
FIG. 8 is an explanatory diagram of a step [A] in a production method of the second anisotropic conductive film of the present invention.

As shown in FIG. 8, the conductive particles 10 are arranged in a single layer on a photopolymerizable resin layer 20 that is formed on a release film 30, if necessary. A procedure of arranging the conductive particles 10 in a single layer in the photopolymerizable resin layer 20 is not particularly limited. A method using a biaxial stretching operation for a resin film to which conductive particles are fixed with an adhesive as described in Example 1 of Japanese Patent No. 4789738, a method using a mold in Japanese Patent Application Laid-Open No. 2010-33793, or other methods may be used. It is preferable that the conductive particles 10 be arranged at predetermined intervals lengthwise and crosswise. In consideration of the size, conduction reliability, insulating properties, and conductive particle capture ratio of a connection subject, the conductive particles are preferably arranged so as to be two-dimensionally apart about 1 to about 100 µm from each other.

Step [B]

Figure 9A:
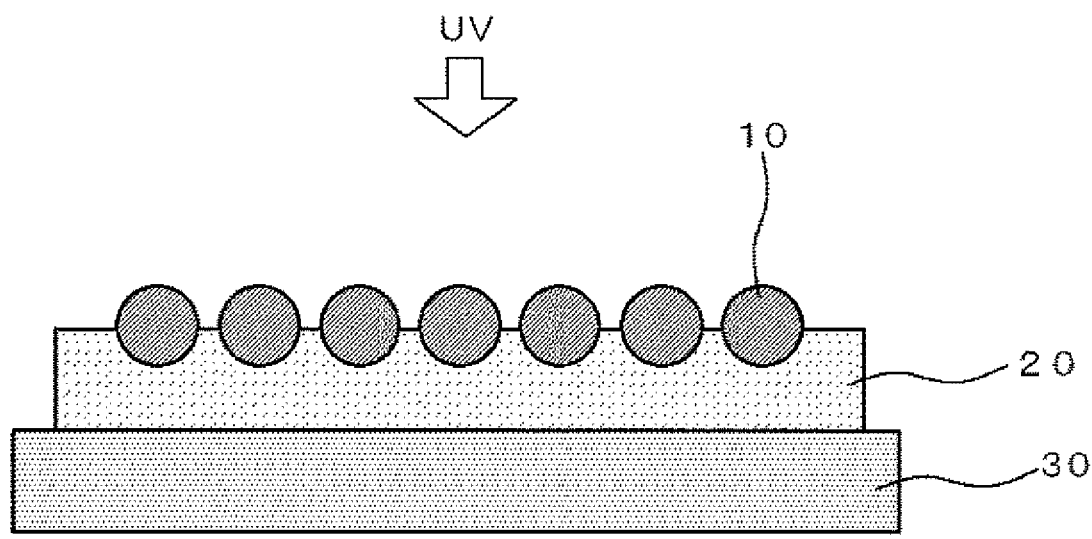
FIG. 9A is an explanatory diagram of a step [B] in the production method of the second anisotropic conductive film of the present invention.
Figure 9B:
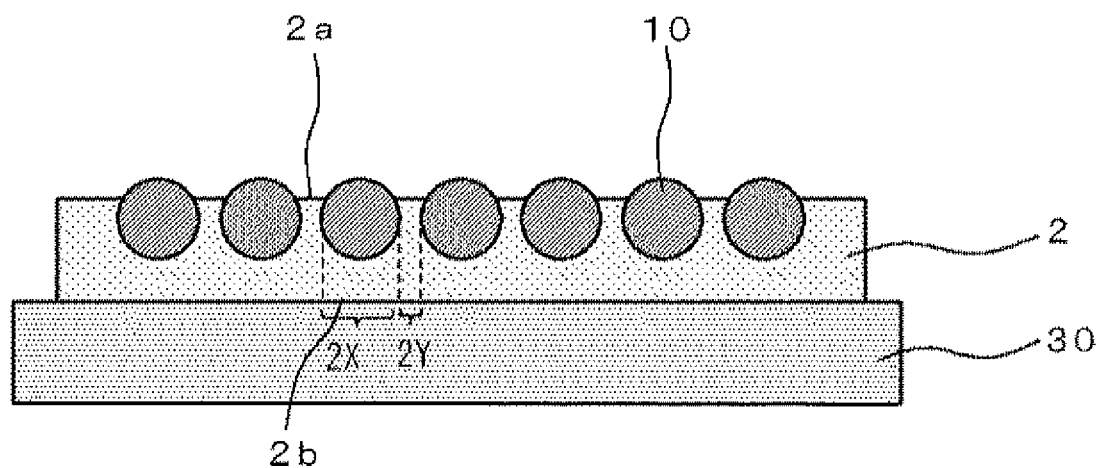
FIG. 9B is an explanatory diagram of the step [B] in the production method of the second anisotropic conductive film of the present invention.

The photopolymerizable resin layer 20 having the arranged conductive particles 10 is then irradiated with ultraviolet light (UV) to cause a photopolymerization reaction, whereby the first insulating resin layer 2 in which the conductive particles 10 are fixed on a surface is formed. In this case, the layer is preferably irradiated with ultraviolet light (UV) from the side of the conductive particles 10, as shown in FIG. 9A. As shown in FIG. 9B, the curing ratio of the first insulating resin layer 2 in the region 2X where the conductive particles 10 are present on a side of the second insulating resin layer 3 in the first insulating resin layer 2 (a region between a surface 2b of the first insulating resin layer 2 on a side of the release film 30 and the conductive particles 10) can be made lower than that in the region 2Y where the conductive particles 10 are not present in the first insulating resin layer 2. Therefore, pushing of the conductive particles 10 during anisotropic conductive connection can be facilitated and the flow of the conductive particles 10 in a connection plane direction can be suppressed.

Step [C]

Figure 10:
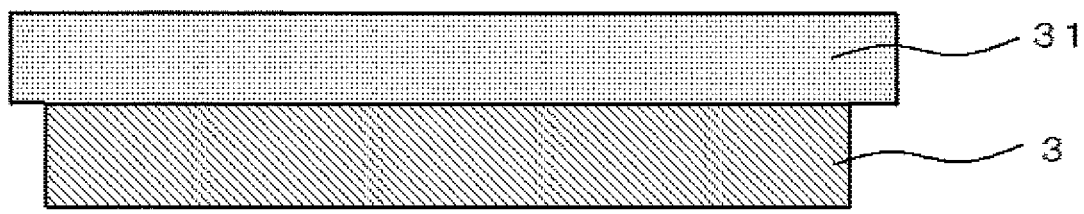
FIG. 10 is an explanatory diagram of a step [C] in the production method of the second anisotropic conductive film of the present invention.

On the other hand, the second insulating resin layer 3 that is formed of a thermo-cationically or thermo-anionically polymerizable resin, a photo-cationically or photo-anionically polymerizable resin, a thermo-radically polymerizable resin, or a photo-radically polymerizable resin is formed on a release film 31 by an ordinary method, as shown in FIG. 10.

Step [D]

The intermediate insulating resin layer 6 is formed on a surface of the first insulating resin layer 2 having the conductive particles 10 fixed in the step [B] on the side of the conductive particles 10.

This step [D] can be performed by the following process (i) or (ii).

Process (i)

Figure 11:
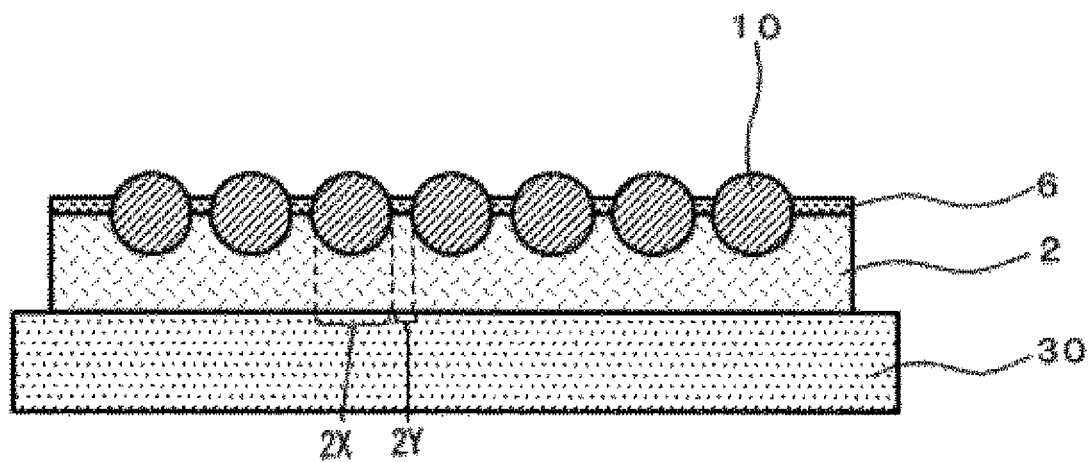
FIG. 11 is an explanatory diagram of a case where the step [D] is performed by a process (i) in the production method of the second anisotropic conductive film of the present invention.

As shown in FIG. 11, the intermediate insulating resin layer 6 is formed on a surface of the first insulating resin layer 2 having the conductive particles 10 fixed in the step [B] on the side of the conductive particles 10. More specifically, a coating liquid for forming the intermediate insulating resin layer that does not contain a polymerization initiator and contains at least one resin selected from a phenoxy resin, an epoxy resin, a polyolefin resin, a polyurethane resin, and an acrylic resin, and preferably contains a filler such as silica is applied to or sprayed on the surface of the first insulating resin layer 2 on the side of the conductive particles 10 to form the intermediate insulating resin layer 6.

Figure 12:
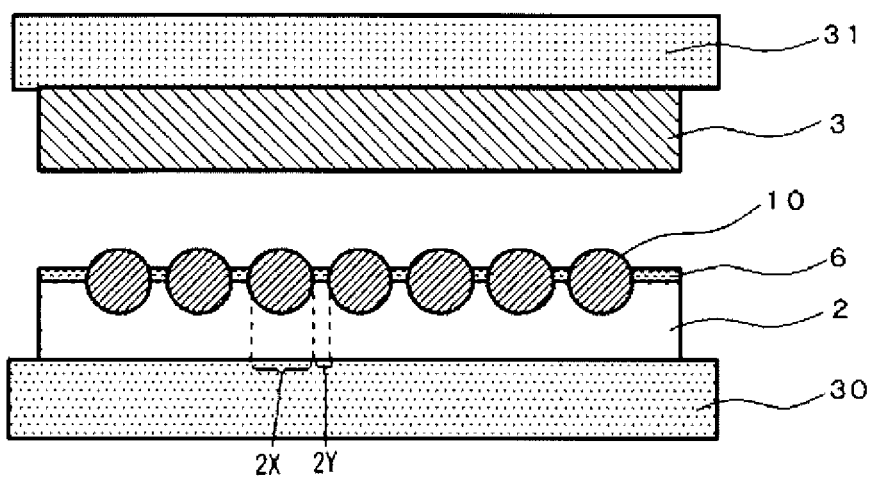
FIG. 12 is an explanatory diagram of a downstream step of the step [D] that is performed by the process (i).
Figure 13:
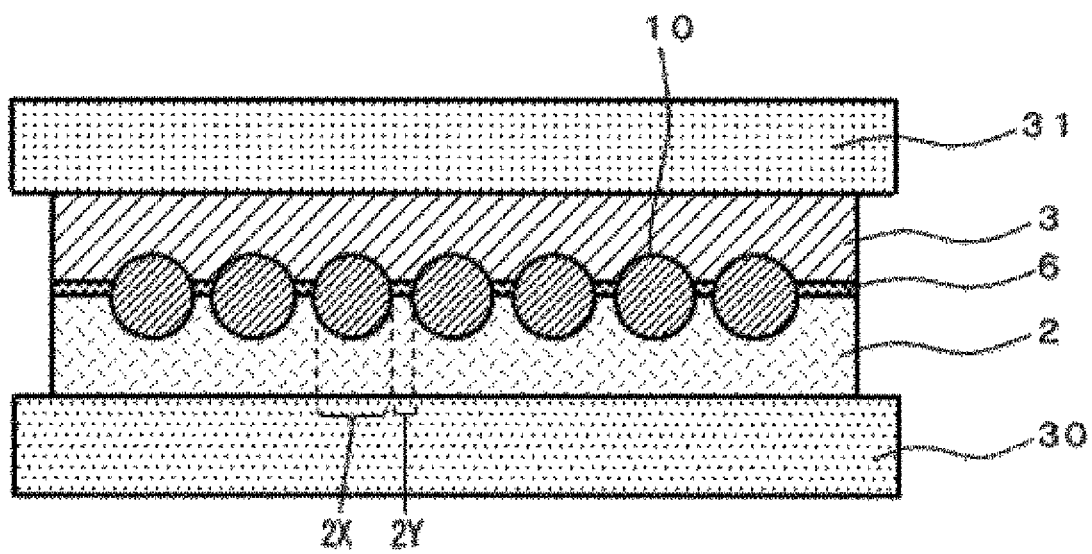
FIG. 13 is a cross-sectional view of the second anisotropic conductive film obtained at the downstream step of the step [D] that is performed by the process (i).

The intermediate insulating resin layer 6 and the second insulating resin layer 3 formed in the step [C] are allowed to face to each other as shown in FIG. 12, and thermocompression-bonded as shown in FIG. 13. In this case, excessive thermal polymerization due to thermocompression bonding is prevented. The release films 30 and 31 are removed. Thus, the second anisotropic conductive film 1B of FIG. 7A can be obtained.

Process (ii)

Figure 14:
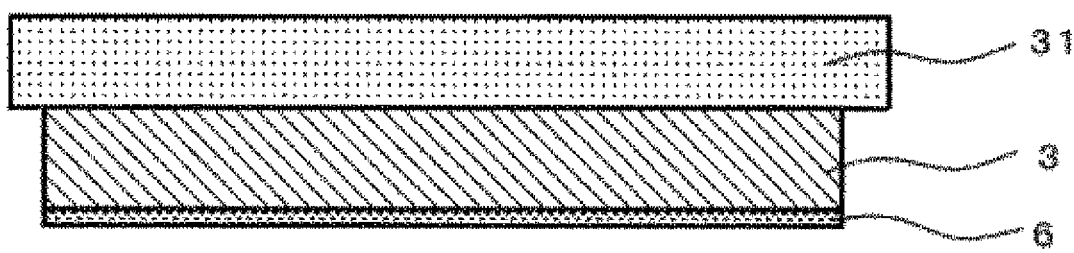
FIG. 14 is an explanatory diagram of a case where the step [D] is performed by a process (ii) in the production of the second anisotropic conductive film of the present invention.
Figure 15:
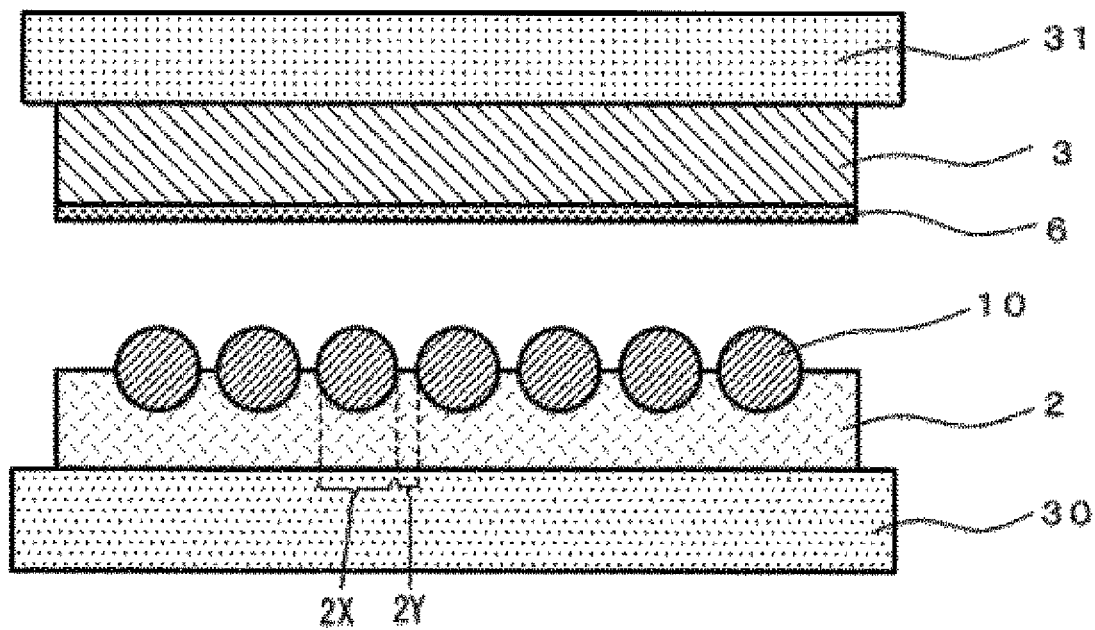
FIG. 15 is an explanatory diagram of the downstream step of the step [D] that is performed by the process (ii).
Figure 16:
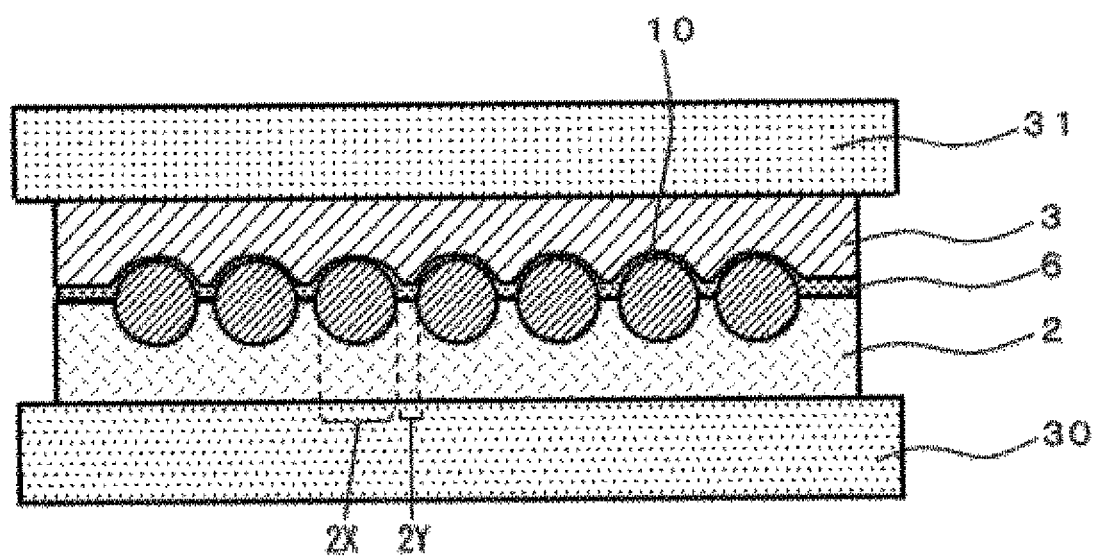
FIG. 16 is a cross-sectional view of an anisotropic conductive film obtained by the downstream step of the step [D] that is performed by the process (ii).

The same coating liquid for forming the intermediate insulating resin layer as that in the process (i) is applied to or sprayed on the surface of the second insulating resin layer 3 formed in the step [C] to form the intermediate insulating resin layer 6 on the second insulating resin layer 3, as shown in FIG. 14. The intermediate insulating resin layer 6 and the conductive particles 10 on the first insulating resin layer 2 formed in the step [B] are allowed to face to each other as shown in FIG. 15, and are thermocompression-bonded as shown in FIG. 16. FIG. 16 shows an aspect in which the conductive particles 10 do not penetrate the intermediate insulating resin layer 6. The release films 30 and 31 are removed. Thus, the second anisotropic conductive film 1B of FIG. 7C can be obtained.

<<Connection Structure>>

The first anisotropic conductive film 1A and the second anisotropic conductive film 1B of the present invention can be preferably applied to anisotropic conductive connection between a first electronic component such as an IC chip and an IC module and a second electronic component such as a flexible substrate and a glass substrate. The resultant connection structure is also a part of the present invention. It is preferable that a surface of the first anisotropic conductive film 1A and the second anisotropic conductive film 1B on the side of the first insulating resin layer 2 be disposed on a side of the second electronic component such as a flexible substrate and a surface of the anisotropic conductive films on the side of the third insulating resin layer 4 or the second insulating resin layer 3 opposite thereto be disposed on a side of the first electronic component such as an IC chip since the conduction reliability is enhanced.

EXAMPLES

Hereinafter, the present invention will be described specifically by Examples.

Examples 1 to 6

First Anisotropic Conductive Film

Comparative Example 1

An anisotropic conductive film of Comparative Example 1 having conductive particles arranged in a single layer in accordance with an operation of Example 1 of Japanese Patent No. 4789738 and a first insulating resin layer and a second insulating resin layer formed in accordance with a composition (parts by mass) of Table 1 was produced. Further, first anisotropic conductive films of Examples 1 to 6 having further a third insulating resin layer were produced.

Specifically, an acrylate compound, a photo-radical polymerization initiator, and the like were mixed in ethyl acetate or toluene to prepare a mixed liquid having a solid content of 50% by mass. This mixed liquid was applied to a polyethylene terephthalate film having a thickness of 50 μm so as to have a dried thickness of 3 μm, and dried in an oven at 80° C. for 5 minutes, to form a photo-radically polymerizable resin layer that was a precursor layer of the first insulating resin layer.

Conductive particles (Ni/Au-plated resin particles, AUL 704, SEKISUI CHEMICAL CO., LTD.) having an average particle diameter of 4 μm were arranged in a single layer and a lattice on a surface of the obtained photo-radically polymerizable resin layer so that the closest distance between the conductive particles was 4 μm.

The photo-radically polymerizable resin layer was irradiated with ultraviolet light having a wavelength of 365 nm at an integrated light amount of 4,000 mJ/cm$^2$ from the side of the conductive particles. Thus, the first insulating resin layer in which the conductive particles were fixed in a surface thereof was formed.

A thermosetting resin, a polymerization initiator, and the like were mixed in ethyl acetate or toluene to prepare a mixed liquid having a solid content of 50% by mass. This mixed liquid was applied to a polyethylene terephthalate film having a thickness of 50 μm so as to have a dried thickness of 12 μm, and dried in an oven at 80° C. for 5 minutes, to form a second insulating resin layer. In the same manner, a third insulating resin layer was formed.

The thus obtained first insulating resin layer and second insulating resin layer were laminated so that the conductive particles were located inside, to obtain an anisotropic conductive film of Comparative Example 1. The third insulating resin layer was further laminated on a surface of the second insulating resin layer of the layered body having the first and second insulating resin layers to obtain a first anisotropic conductive film of each of Examples 1 to 6.

Example 7

A first anisotropic conductive film was obtained in the same manner as in Example 1 except that a photo-radically polymerizable resin layer was irradiated with ultraviolet light at an integrated light amount of 2,000 mJ/cm$^2$ from a side of the conductive particles and a side opposite to the conductive particles.

Evaluation

An IC chip having a size of 0.5×1.8×20.0 mm (bump size: 30×85 μm, bump height: 15 μm, bump pitch: 50 μm) was mounted on a glass wiring substrate (1737F) having a size of 0.5×50×30 mm available from Corning Incorporated using the first anisotropic conductive film of each of Examples 1 to 7 and Comparative Example 1 under conditions of 180° C., 80 MPa, and 5 seconds to obtain a connection structure sample.

As described below, "warping," "initial conduction," "conduction reliability," and "short circuit occurrence ratio" in the obtained connection structure samples were tested and evaluated. The results thereof are shown in Table 1.

"Warping"

For a warping of a connection body, a warping on a surface of the glass substrate on a side where the IC chip was not mounted at a width corresponding to the back side of the IC chip of 20 mm was measured by a commercially available three-dimensional measurement device (KEYENCE CORPORATION).

In practical terms, the warping is preferably less than 15 μm.

"Initial Conduction"

The conduction resistance of each of the connection structure samples was measured. A conduction resistance of 0.5Ω or less was evaluated as OK, and a conduction resistance of larger than 0.5Ω was evaluated as NG.

"Conduction Reliability"

Each of the connection structure samples was allowed to stand under a high temperature and high humidity environment of 85° C. and 85% RH for 500 hours. The conduction resistance was then measured similarly to the initial conduction. A conduction resistance of 5Ω or less was evaluated as OK, and a conduction resistance of larger than 5Ω was evaluated as NG in terms of practical conduction stability of a connected electronic component.

"Short Circuit Occurrence Ratio"

As an IC for evaluation of short circuit occurrence ratio, an IC of a comb-teeth TEG pattern having a space of 7.5 μm (outer diameter: 1.5×13 mm, thickness: 0.5 mm, bump specification: gold-plated, height: 15 μm, size: 25×140 μm, bump gap: 7.5 μm) was prepared. The anisotropic conductive film of each of Examples and Comparative Example was disposed between the IC for evaluation of short circuit occurrence ratio and a glass substrate of a pattern corresponding to the pattern of the IC, and heated and pressurized under the same condition as in a case of initial conduction, to obtain a connection body. The short circuit occurrence ratio of the connection body was calculated by "number of short circuit occurrence/total number of spaces of 7.5 μm." The short circuit occurrence ratio is desirably 100 ppm or less in practical terms. A short circuit occurrence ratio of 100 ppm or less was evaluated as OK, and a short circuit occurrence ratio of larger than 100 ppm was evaluated as NG.

A coating liquid for an intermediate insulating resin layer was prepared at a composition shown in Table 2, and was applied to the first insulating resin layer in which the

TABLE 1

(Composition: Part(S) By Mass)

| | | | | Example | | | | | | Comparative Example |
|---|---|---|---|---|---|---|---|---|---|---|
| | | | | 1 | 2 | 3 | 4 | 5 | 6 | 1 |
| First Insulating Resin Layer | Phenoxy Resin | YP-50 | Nippon Steel & Sumikin Chemical Co., Ltd. | 60 | 60 | 60 | 60 | 60 | 60 | 60 |
| | Acrylate | EB600 | Daicel-Allnex Ltd. | 40 | 40 | 40 | 40 | 40 | 40 | 40 |
| | Photo-Radical Polymerization Initiator | IRGACURE 369 | BASF Japan Ltd. | 2 | 2 | 2 | 2 | 2 | 2 | 2 |
| | Thermal Cationic Polymerization Initiator | SI-60L | Sanshin Chemical Industry Co., Ltd. | 2 | 2 | 2 | 2 | 2 | 2 | 2 |
| | Conductive Particle | AUL704 | Sekisui Chemical Co., Ltd. | Single-Layer Arrangement | | | | | | |
| Second Insulating Resin Layer | Phenoxy Resin | YP-50 | Nippon Steel & Sumikin Chemical Co., Ltd. | 60 | 60 | 60 | 60 | 60 | 60 | 60 |
| | Epoxy Resin | jER828 | Mitsubishi Chemical Corporation | 40 | 40 | 40 | 40 | 40 | 40 | 40 |
| | Thermal Cationic Polymerization Initiator | SI-60L | Sanshin Chemical Industry Co., Ltd. | 2 | 2 | 2 | 2 | 2 | 2 | 2 |
| Third Insulating Resin Layer | Phenoxy Resin | YP-50 | Nippon Steel & Sumikin Chemical Co., Ltd. | 70 | 70 | 80 | 80 | 70 | 70 | — |
| | Epoxy Resin | jER828 | Mitsubishi Chemical Corporation | 30 | — | 20 | — | 30 | — | — |
| | Thermal Cationic Polymerization Initiator | SI-60L | Sanshin Chemical Industry Co., Ltd. | 2 | — | 2 | — | 2 | — | — |
| | Acrylate | EB600 | Daicel-Allnex Ltd. | — | 30 | — | 20 | — | 30 | — |
| | Organic Peroxide | Perhexyl Z | NOF Corporation | — | 2 | — | 2 | — | 2 | — |
| Thickness of First Insulating Resin Layer (μm) | | | | 6 | 6 | 6 | 6 | 6 | 6 | 6 |
| Thickness of Second Insulating Resin Layer (μm) | | | | 12 | 12 | 12 | 12 | 10 | 10 | 12 |
| Thickness of Third Insulating Resin Layer (μm) | | | | 3 | 3 | 3 | 3 | 5 | 5 | — |
| Warping (μm) | | | | 12 | 12 | 10 | 10 | 10 | 10 | 15 |
| Initial Conduction (Ω) | | | | OK | OK | OK | OK | OK | OK | OK |
| Conduction Reliability (Ω) | | | | OK | OK | OK | OK | OK | OK | OK |
| Short Circuit Occurrence Ratio (ppm) | | | | OK | OK | OK | OK | OK | OK | OK |

As seen from Table 1, the first anisotropic conductive films in Examples 1 to 6 had a warping of less than 15 μm. The first anisotropic conductive films of Examples 1 to 6 had an initial conduction of 0.5Ω, a conduction reliability of 4Ω, and a short circuit occurrence ratio of 50 ppm, and exhibited preferable results in practical terms in all evaluation items. The first anisotropic conductive film of Example 7 had a conduction reliability lower than that in Example 1, but did not have a problem in practical terms, and exhibited the same preferable results as in Example 1 in practical terms in warping, initial conduction, and short circuit occurrence ratio.

On the other hand, the anisotropic conductive film of Comparative Example 1 had a large warping due to the absence of the third insulating resin layer.

Examples 8 to 17

Second Anisotropic Conductive Film

Second anisotropic conductive films of Examples 8 to 17 having a first insulating resin layer, an intermediate insulating resin layer, and a second insulating resin layer that were formed in accordance with a composition (parts by mass) in Table 2 in which conductive particles were arranged in a single layer in accordance with an operation of Example 1 of Japanese Patent No. 4789738 and penetrated the intermediate insulating resin layer as shown in FIG. 7A were produced.

Specifically, the first insulating resin layer in which the conductive particles were fixed in the surface was first formed in the same manner as in Example 1.

conductive particles were fixed. Thus, the intermediate insulating resin layer was formed.

In order to form the second insulating resin layer, a thermosetting resin, a polymerization initiator, and the like were mixed in ethyl acetate or toluene to prepare a mixed liquid having a solid content of 50% by mass. This mixed liquid was applied to a polyethylene terephthalate film having a thickness of 50 μm so as to have a dried thickness of 12 μm, and dried in an oven at 80° C. for 5 minutes, to form the second insulating resin layer.

The first insulating resin layer in which the conductive particles were fixed and the second insulating resin layer were laminated so that the conductive particles were located inside, to obtain the second anisotropic conductive films of Examples 8 to 17.

Example 18

A second anisotropic conductive film was obtained in the same manner as in Example 9 except that a photo-radically polymerizable resin layer was irradiated with ultraviolet light at an integrated light amount of 2,000 mJ/cm² from a side of the conductive particles and a side opposite to the conductive particles.

Example 19

A second anisotropic conductive film was obtained in the same manner as in Example 9 except that the thickness of the intermediate insulating resin layer was set to 5 μm. In the second anisotropic conductive film, the conductive particles did not penetrate the intermediate insulating resin layer.

Example 20

A second anisotropic conductive film was obtained in the same manner as in Example 18 except that the thickness of an intermediate insulating resin layer was set to 5 μm. In the second anisotropic conductive film, the conductive particles did not penetrate the intermediate insulating resin layer.

Evaluation

An IC chip having a size of 0.5×1.8×20.0 mm (bump size: 30×85 μm, bump height: 15 μm, bump pitch: 50 μm) was mounted on a glass wiring substrate (1737F) having a size of 0.5×50×30 mm available from Corning Incorporated using the second anisotropic conductive film of each of Examples 8 to 20 under conditions of 180° C., 80 MPa, and 5 seconds to obtain a connection structure sample.

As described below, "mounting particle capture efficiency," "initial conduction," "conduction reliability," "warping," and "short circuit occurrence ratio" in the obtained connection structure samples and the connection structure sample using the anisotropic conductive film of the aforementioned Comparative Example 1 were evaluated on a test.

The results thereof are shown in Table 1.

"Mounting Particle Capture Efficiency"

The ratio (%) of the "number of conductive particles actually captured on a bump of the connection structure sample after heating and pressurization" to the "number of conductive particles existing on the bump of the connection structure sample before heating and pressurization" was determined by the following expression. The ratio was taken as a mounting particle capture efficiency.

The number of conductive particles existing on the bump of the connection structure sample before heating and pressurization was calculated from the number density of the conductive particles and the bump area of the anisotropic conductive film before heating and pressurization in anisotropic conductive connection. The number of conductive particles existing on the bump of the connection structure sample after heating and pressurization was determined by observation by an optical microscope.

In practical terms, the ratio is preferably 50% or more.

Mounting Conductive Particle Capture Ratio (%)={
[the number of conductive particles on bump after heating and pressurization]/[the number of conductive particles on bump before heating and pressurization]}×100

"Initial Conduction"

The conduction resistance of the connection structure sample was measured in the same manner as in Example 1. A conduction resistance of 0.5Ω or less was evaluated as OK, and a conduction resistance of larger than 0.5Ω was evaluated as NG.

"Conduction Reliability"

The connection structure sample was allowed to stand under a high temperature and high humidity environment of 85° C. and 85%RH for 500 hours and the conduction resistance was then measured in the same manner as in Example 1. A conduction resistance of 5Ω or less was evaluated as OK, and a conduction resistance of larger than 5Ω was evaluated as NG.

"Warping"

A warping of the glass wiring substrate was measured in the same manner as in Example 1.

"Short Circuit Occurrence Ratio"

A short circuit occurrence ratio of the connection body having the IC for evaluation of short circuit occurrence ratio and the glass substrate was calculated in the same manner as in Example 1. A short circuit occurrence ratio of 100 ppm or less was evaluated as OK, and a short circuit occurrence ratio of larger than 100 ppm was evaluated as NG.

TABLE 2

| | | | | Example | | | | | | | | | | Comparative Example |
|---|---|---|---|---|---|---|---|---|---|---|---|---|---|---|
| | | | | 8 | 9 | 10 | 11 | 12 | 13 | 14 | 15 | 16 | 17 | 1 |
| First Insulating Resin Layer | Phenoxy Resin | YP-50 | Nippon Steel & Sumikin Chemical Co., Ltd. | 60 | 60 | 60 | 60 | 60 | 60 | 60 | 60 | 60 | 60 | 60 |
| | Acrylate | EB600 | Daicel-Allnex Ltd. | 40 | 40 | 40 | 40 | 40 | 40 | 40 | 40 | 40 | 40 | 40 |
| | Photo-Radical Polymerization Initiator | IRGACURE 369 | BASF Japan Ltd. | 2 | 2 | 2 | 2 | 2 | 2 | 2 | 2 | 2 | 2 | 2 |
| | Thermal Cationic Polymerization Initiator | SI-60L | Sanshin Chemical Industry Co., Ltd. | 2 | 2 | 2 | 2 | 2 | 2 | 2 | 2 | 2 | 2 | 2 |
| | Conductive Particle | AUL704 | Sekisui Chemical Co., Ltd. | | | | | Single-Layer Arrangement | | | | | | |
| Intermediate Insulating Resin Layer | Phenoxy Resin | YP-50 | Nippon Steel & Sumikin Chemical Co., Ltd. | 90 | 80 | 60 | 60 | 70 | 75 | 80 | 80 | 80 | 80 | — |
| | Epoxy Resin | YL980 | Mitsubishi Chemical Corporation | 10 | 20 | 40 | 20 | 20 | 20 | 20 | 20 | 20 | 20 | — |
| | Ethylene-based Resin | V5772ET | Dupont-Mitui Polychemicals Co., Ltd. | | | | | 20 | 10 | 5 | | | | — |

TABLE 2-continued

| | | | | (Composition: Part(S) By Mass) | | | | | | | | | | |
|---|---|---|---|---|---|---|---|---|---|---|---|---|---|---|
| | | | | Example | | | | | | | | | | Comparative Example |
| | | | | 8 | 9 | 10 | 11 | 12 | 13 | 14 | 15 | 16 | 17 | 1 |
| Second Insulating Resin Layer | Phenoxy Resin | YP-50 | Nippon Steel & Sumikin Chemical Co., Ltd. | 60 | 60 | 60 | 60 | 60 | 60 | 60 | 60 | 60 | 60 | 60 |
| | Epoxy Resin | jER828 | Mitsubishi Chemical Corporation | 40 | 40 | 40 | 40 | 40 | 40 | 40 | 40 | 40 | 40 | 40 |
| | Thermal Cationic Polymerization Initiator | SI-60L | Sanshin Chemical Industry Co., Ltd. | 2 | 2 | 2 | 2 | 2 | 2 | 2 | 2 | 2 | 2 | 2 |
| Thickness of First Insulating Resin Layer (μm) | | | | 6 | 6 | 6 | 6 | 6 | 6 | 6 | 6 | 6 | 6 | 6 |
| Thickness of Intermediate Insulating Resin Layer (μm) | | | | 2 | 2 | 2 | 2 | 2 | 2 | 1 | 2.8 | 3.9 | 4 | — |
| Thickness of Second Insulating Resin Layer (μm) | | | | 12 | 12 | 12 | 12 | 10 | 12 | 12 | 12 | 10 | 10 | 12 |
| Mounting Particle Capture Efficiency (%) | | | | More than 70 | More than 70 | More than 70 | More than 70 | More than 70 | More than 70 | More than 70 | More than 70 | More than 70 | More than 70 | 50 |
| Initial Conduction (Ω) | | | | OK | OK | OK | OK | OK | OK | OK | OK | OK | OK | OK |
| Conduction Reliability (Ω) | | | | OK | OK | OK | OK | OK | OK | OK | OK | OK | OK | OK |
| Warping (μm) | | | | 13.5 | 13.3 | 13.4 | 11.6 | 12.3 | 12.7 | 14.1 | 13.7 | 12.5 | 12.4 | 15.0 |
| Short Circuit Occurrence Ratio (ppm) | | | | OK | OK | OK | OK | OK | OK | OK | OK | OK | OK | OK |

As seen from Table 2, the second anisotropic conductive films of Examples 8 to 17 had a mounting particle capture efficiency of more than 70% and a warping of less than 15 μm. The second anisotropic conductive films of Examples 8 to 17 had an initial conduction of 0.2Ω, a conduction reliability of 4Ω, and a short circuit occurrence ratio of 50 ppm, and exhibited preferable results in practical terms in all evaluation items.

The connection structures of Examples 18 and 20 had a mounting particle capture efficiency lower than that of Example 9, but did not have a problem in practical terms, and exhibited the same preferable results as in Example 9 in initial conduction, conduction reliability, warping, and short circuit occurrence ratio.

Observing the connection structure of Example 19 by a microscope, the shapes of conductive particles connected to a bump were slightly nonuniform as compared with Example 9, but the connection structure exhibited preferable results in practical terms in all evaluation items of mounting particle capture efficiency, initial conduction, conduction reliability, warping, and short circuit occurrence ratio.

On the other hand, the anisotropic conductive film of Comparative Example 1 had a lower mounting particle capture efficiency and a large warping due to the absence of the intermediate insulating resin layer.

INDUSTRIAL APPLICABILITY

In the first anisotropic conductive film and the second anisotropic conductive film of the present invention, the first insulating resin layer that is obtained by photo-radically polymerizing a photo-radically polymerizable resin layer and the second insulating resin layer formed of a thermo-cationically or thermo-anionically polymerizable resin, a photo-cationically or photo-anionically polymerizable resin, a thermo-radically polymerizable resin layer, or a photo-radically polymerizable resin are layered, and the conductive particles are disposed in a single layer on a surface of the first insulating resin layer on a side of the second insulating resin layer. Therefore, excellent initial conduction, conduction reliability, and insulating properties (low short circuit occurrence ratio) due to favorable conductive particle capture ratio are shown.

In the first anisotropic conductive film, the third insulating resin layer is layered on the second insulating resin layer. Therefore, a stress during using the anisotropic conductive film for anisotropic conductive connection is relaxed. Thus, the occurrence of a warping in a connection body obtained by anisotropic conductive connection can be suppressed. In the second anisotropic conductive film, the intermediate insulating resin layer is layered between the first insulating resin layer and the second insulating resin layer so as to surround the conductive particles. Thus a stress applied to the conductive particles is relaxed, and the conductive particle capture ratio during anisotropic conductive connection is further improved.

Therefore, the first anisotropic conductive film and the second anisotropic conductive film of the present invention are useful in anisotropic conductive connection of an electronic component such as an IC chip to a wiring substrate. The width of the wiring of the electronic component has been decreased. The present invention is particularly useful in anisotropic conductive connection of an electronic component having a decreased wiring width.

REFERENCE SIGNS LIST 1A first anisotropic conductive film
1B second anisotropic conductive film
2 first insulating resin layer
2a surface of first insulating resin layer
2b surface of first insulating resin layer
2X region where conductive particles are present on the side of second insulating resin layer in first insulating resin layer
2Y region where conductive particles are not present in first insulating resin layer
2 second insulating resin layer
4 third insulating resin layer
5 layered body
6 intermediate insulating resin layer
10 conductive particle
20 photopolymerizable resin layer 30 release film
31 release film

The invention claimed is:

1. An anisotropic conductive film comprising a first insulating resin layer, a second insulating resin layer, and a third insulating resin layer that are layered in sequence, wherein
the first insulating resin layer is formed of a photopolymerized resin,
the second insulating resin layer and the third insulating resin layer are each formed of a thermo-cationically or thermo-anionically polymerizable resin, a photo-cationically or photo-anionically polymerizable resin, a thermo-radically polymerizable resin, or a photo-radically polymerizable resin,
the first insulating resin layer has conductive particles for anisotropic conductive connection arranged in a single layer on a top surface thereof on a side of the second insulating resin layer, and the conductive particles are in contact with or anchors to the second insulating resin layer, and
a content of an acrylate compound in the first insulating resin layer is in a range of from 2 to 70% by mass.

2. The anisotropic conductive film according to claim 1, wherein in the first insulating resin layer, a curing ratio in a region where the conductive particles are present on the side of the second insulating resin layer is lower than a curing ratio in a region where the conductive particles are not present on the side of the second insulating resin layer.

3. The anisotropic conductive film according to claim 1, wherein the first insulating resin layer is obtained by photo-radically polymerizing a photo-radically polymerizable resin layer containing an acrylate compound and a photo-radical polymerization initiator.

4. The anisotropic conductive film according to claim 3, wherein the first insulating resin layer includes the remaining acrylate compound and photo-radical polymerization initiator.

5. The anisotropic conductive film according to claim 1, wherein the first insulating resin layer contains an acrylate compound and a thermal radical polymerization initiator.

6. The anisotropic conductive film according to claim 1, wherein the first insulating resin layer contains an epoxy compound, and a thermal cationic or thermal anionic polymerization initiator or a photo-cationic or photo-anionic polymerization initiator.

7. The anisotropic conductive film according to claim 1, wherein the second insulating resin layer is formed of a polymerizable resin containing an epoxy compound, and a thermal cationic or thermal anionic polymerization initiator or a photo-cationic or photo-anionic polymerization initiator, or a polymerizable resin containing an acrylate compound and a thermal radical or photo-radical polymerization initiator.

8. The anisotropic conductive film according to claim 1, wherein the third insulating resin layer is formed of a polymerizable resin containing an epoxy compound, and a thermal cationic or thermal anionic polymerization initiator or a photo-cationic or photo-anionic polymerization initiator, or a polymerizable resin containing an acrylate compound and a thermal radical or photo-radical polymerization initiator.

9. The anisotropic conductive film according to claim 1, wherein a thickness of the third insulating resin layer is ½ or less of a thickness of the second insulating resin layer.

10. A production method of the anisotropic conductive film according to claim 1, the production method comprising the following steps (A) to (D):
Step (A)
a step of disposing conductive particles in a single layer on a photopolymerizable resin layer;
Step (B)
a step of irradiating the photopolymerizable resin layer having the disposed conductive particles with ultraviolet light to cause a photopolymerization reaction, thereby forming the first insulating resin layer in which the conductive particles are fixed in a surface thereof;
Step (C)
a step of layering the second insulating resin layer that is formed of a thermo-cationically or thermo-anionically polymerizable resin, a photo-cationically or photo-anionically polymerizable resin, a thermo-radically polymerizable resin, or a photo-radically polymerizable resin on the surface of the first insulating resin layer on a side of the conductive particles; and
Step (D)
a step of layering the third insulating resin layer that is formed of a thermo-cationically or thermo-anionically polymerizable resin, a photo-cationically or photo-anionically polymerizable resin, a thermo-radically polymerizable resin, or a photo-radically polymerizable resin on a surface of the second insulating resin layer, wherein
the step (D) is performed before or after the step (C).

11. The production method of the anisotropic conductive film according to claim 10, wherein the step (B) is irradiating with ultraviolet light from the side of the conductive particles.

12. The production method of the anisotropic conductive film according to claim 10, wherein the photopolymerizable resin forming the first insulating resin layer includes an acrylate compound and a photo-radical polymerization initiator.

13. The production method of the anisotropic conductive film according to claim 10, wherein the photopolymerizable resin forming the first insulating resin layer contains a thermal radical polymerization initiator.

14. The production method of the anisotropic conductive film according to claim 10, wherein the photopolymerizable resin forming the first insulating resin layer contains an epoxy compound, and a thermal cationic or thermal anionic polymerization initiator or a photo-cationic or photo-anionic polymerization initiator.

15. The production method of the anisotropic conductive film according to claim 10, wherein the second insulating resin layer is formed of a polymerizable resin containing an epoxy compound, and a thermal cationic or thermal anionic polymerization initiator or a photo-cationic or photo-anionic polymerization initiator, or a polymerizable resin containing an acrylate compound and a thermal radical or photo-radical polymerization initiator.

16. The production method of the anisotropic conductive film according to claim 10, wherein the third insulating resin layer is formed of a polymerizable resin containing an epoxy compound, and a thermal cationic or thermal anionic polymerization initiator or a photo-cationic or photo-anionic polymerization initiator, or a polymerizable resin containing an acrylate compound and a thermal radical or photo-radical polymerization initiator.

17. The production method of the anisotropic conductive film according to claim 10, wherein a thickness of the third insulating resin layer is ½ or less of a thickness of the second insulating resin layer.

18. A connection structure in which a first electronic component and a second electronic component are connected by anisotropic conduction through the anisotropic conductive film according to claim 1.

19. An anisotropic conductive film comprising a first insulating resin layer, an intermediate insulating resin layer, and a second insulating resin layer that are layered in sequence, wherein
the first insulating resin layer is formed of a photopolymerized resin,
the second insulating resin layer is formed of a thermo-cationically or thermo-anionically polymerizable resin, a photo-cationically or photo-anionically polymerizable resin, a thermo-radically polymerizable resin, or a photo-radically polymerizable resin,
the intermediate insulating resin layer is formed of a resin containing no polymerization initiator,
the first insulating resin layer has conductive particles for anisotropic conductive connection arranged in a single layer on a top surface thereof on a side of the intermediate insulating resin layer, and the conductive particles are in contact with the intermediate insulting resin layer, and the conductive particles are in contact with or anchors to or penetrate the intermediate insulating resin layer, and
a content of an acrylate compound in the first insulating resin layer is in a range of from 2 to 70% by mass.

20. The anisotropic conductive film according to claim 19, wherein the intermediate insulating resin layer has a thickness of 1.2 times or less particle diameters of the conductive particles.

21. The anisotropic conductive film according to claim 19, wherein the conductive particles penetrate the intermediate insulating resin layer.

22. The anisotropic conductive film according to claim 19, wherein the intermediate insulating resin layer contains a filler.

23. The anisotropic conductive film according to claim 19, wherein the intermediate insulating resin layer contains at least one selected from a phenoxy resin, an epoxy resin, a polyolefin resin, a polyurethane resin, and an acrylic resin.

24. The anisotropic conductive film according to claim 19, wherein in the first insulating resin layer, a curing ratio in a region where the conductive particles are present on the side of the second insulating resin layer is lower than a curing ratio in a region where the conductive particles are not present on the side of the second insulating resin layer.

25. The anisotropic conductive film according to claim 19, wherein the first insulating resin layer is obtained by photo-radically polymerizing a photo-radically polymerizable resin layer containing an acrylate compound and a photo-radical polymerization initiator.

26. The anisotropic conductive film according to claim 25, wherein the first insulating resin layer includes the remaining acrylate compound and photo-radical polymerization initiator.

27. The anisotropic conductive film according to claim 19, wherein the first insulating resin layer contains an acrylate compound and a thermal radical polymerization initiator.

28. The anisotropic conductive film according to claim 19, wherein the first insulating resin layer contains an epoxy compound and a thermal cationic or thermal anionic polymerization initiator or a photo-cationic or photo-anionic polymerization initiator.

29. The anisotropic conductive film according to claim 19, wherein the second insulating resin layer is formed of a polymerizable resin containing an epoxy compound, and a thermal cationic or thermal anionic polymerization initiator or a photo-cationic or photo-anionic polymerization initiator, or a polymerizable resin containing an acrylate compound and a thermal radical or photo-radical polymerization initiator.

30. A production method of the anisotropic conductive film according to claim 19, the production method comprising the following steps [A] to [D]:
Step [A]
a step of disposing conductive particles in a single layer on a photopolymerizable resin layer;
Step [B]
a step of irradiating the photopolymerizable resin layer having the disposed conductive particles with ultraviolet light to cause a photopolymerization reaction, thereby forming the first insulating resin layer in which the conductive particles are fixed in a surface thereof;
Step [C]
a step of forming the second insulating resin layer that is formed of a thermo-cationically or thermo-anionically polymerizable resin, a photo-cationically or photo-anionically polymerizable resin, a thermo-radically polymerizable resin, or a photo-radically polymerizable resin; and
Step [D]
a step of forming the intermediate insulating resin layer formed of a resin containing no polymerization initiator on a surface of the first insulating resin layer on a side of the conductive particles, wherein
(i) the step [D] is performed after the step [B] to form the intermediate insulating resin layer on the surface of the first insulating resin layer on the side of the conductive particles, and the intermediate insulating resin layer and the second insulating resin layer formed in the step [C] are then layered, or
(ii) the intermediate insulating resin layer formed of the resin containing no polymerization initiator is formed on the second insulating resin layer formed in the step [C], and the intermediate insulating resin layer is layered on the surface of the first insulating resin layer formed in the step [B] on the side of the conductive particles.

31. The production method of the anisotropic conductive film according to claim 30, wherein the intermediate insulating resin layer has a thickness of 1.2 times or less particle diameters of the conductive particles.

32. The production method of the anisotropic conductive film according to claim 30, wherein the intermediate insulating resin layer contains a filler.

33. The production method of the anisotropic conductive film according to claim 30, wherein the intermediate insulating resin layer contains at least one selected from a phenoxy resin, an epoxy resin, a polyolefin resin, a polyurethane resin, and an acrylic resin.

34. The production method of the anisotropic conductive film according to claim 30, wherein in the step [B] the photopolymerizable resin layer is irradiated with ultraviolet light from the side of the conductive particles.

35. The production method of the anisotropic conductive film according claim 30, wherein the photopolymerizable resin forming the first insulating resin layer includes an acrylate compound and a photo-radical polymerization initiator.

36. The production method of the anisotropic conductive film according to claim 30, wherein the photopolymerizable resin forming the first insulating resin layer further contains a thermal radical polymerization initiator.

37. The production method of the anisotropic conductive film according to claim 30, wherein the photopolymerizable resin forming the first insulating resin layer contains an epoxy compound and a photo-cationic or photo-anionic polymerization initiator.

38. The production method of the anisotropic conductive film according to claim 30, wherein the first insulating resin layer further contains a thermal cationic or thermal anionic polymerization initiator.

39. The production method of the anisotropic conductive film according to claim 30, wherein the second insulating resin layer is formed of a polymerizable resin containing an epoxy compound, and a thermal cationic or thermal anionic polymerization initiator or a photo-cationic or photo-anionic polymerization initiator, or a polymerizable resin containing an acrylate compound and a thermal radical or photo-radical polymerization initiator.

40. A connection structure in which a first electronic component and a second electronic component are connected by anisotropic conduction through the anisotropic conductive film according to claim 19.

* * * * *